United States Patent [19]

Kaneno et al.

[11] Patent Number: 5,426,658

[45] Date of Patent: Jun. 20, 1995

[54] SEMICONDUCTOR LASER INCLUDING RIDGE CONFINING BUFFER LAYER

[75] Inventors: Nobuaki Kaneno; Hirotaka Kizuki; Norio Hayafuji; Tetsuo Shiba; Hitoshi Tada, all of Itami, Japan

[73] Assignee: Mitsubishi Denki Kabushiki Kaisha, Tokyo, Japan

[21] Appl. No.: 200,483

[22] Filed: Feb. 23, 1994

Related U.S. Application Data

[62] Division of Ser. No. 975,109, Nov. 12, 1992, Pat. No. 5,316,967.

[30] Foreign Application Priority Data

Jan. 21, 1992 [JP] Japan ................................ 4-31379
May 13, 1992 [JP] Japan ............................... 4-148262

[51] Int. Cl.$^6$ .............................................. H01S 3/19
[52] U.S. Cl. ........................................ 372/46; 372/45
[58] Field of Search ........................................ 372/45, 46

[56] References Cited

U.S. PATENT DOCUMENTS 5,146,295  9/1992  Imanaka et al. ........................ 372/44

FOREIGN PATENT DOCUMENTS

| 61-244023 | 10/1986 | Japan . |
| 62-177991 | 8/1987 | Japan . |
| 63-269593 | 11/1988 | Japan . |
| 63-304617 | 12/1988 | Japan . |
| 64-59983 | 3/1989 | Japan . |
| 64-84780 | 3/1989 | Japan . |
| 1270287 | 10/1989 | Japan . |
| 0287980 | 11/1989 | Japan ............................ 372/46 |
| 1287980 | 11/1989 | Japan . |
| 214591 | 1/1990 | Japan . |
| 231487 | 2/1990 | Japan . |

OTHER PUBLICATIONS

Suzuki et al, "Low–Noise Semiconductor Laser For Optical Pick–up", 1985, pp. 576–578 (No Month).
Mitsubishi Denki Giho, vol. 62, No. 11, 1988, pp. 958–961 (No Month).
Shimoyama et al, "A New Selective MOVPE Regrowth Process Utilizing In–Situ Vapor Phase Etching For Optoelectronic Integrated Circuits", Metalorganic Vapor Phase Epitaxy 1990, pp. 767–771 (No Month).

*Primary Examiner*—James W. Davie
*Attorney, Agent, or Firm*—Leydig, Voit & Mayer

[57] ABSTRACT

A semiconductor laser device including a semiconductor substrate; a plurality of semiconductor layers including an AlGaAs layer epitaxially grown on said semiconductor substrate; a ridge having a reverse mesa shape and opposed sides formed of said plurality of semiconductor layers; an $Al_xGa_{1-x}As$ low temperature buffer layer ($0 \leq X \leq 1$) disposed on said AlGaAs layer at opposite sides of said ridge; a first semiconductor layer epitaxially disposed on said low temperature buffer layer at opposite sides of said ridge; and a second semiconductor layer epitaxially disposed on said ridge and said first semiconductor layer.

3 Claims, 19 Drawing Sheets

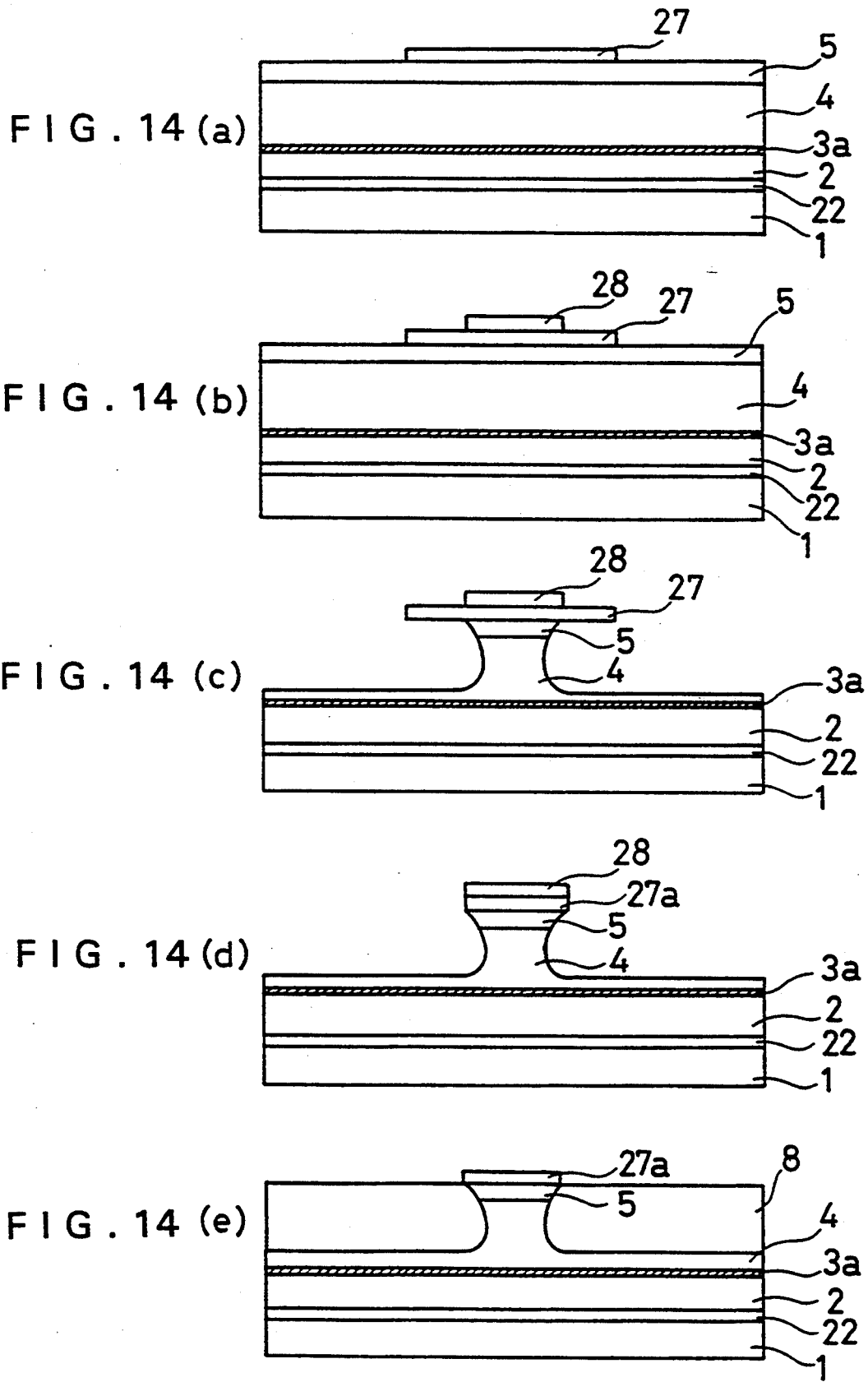

SEMICONDUCTOR LASER INCLUDING RIDGE CONFINING BUFFER LAYER

This disclosure is a division of application Ser. No. 07/975,109, filed Nov. 12, 1992 now U.S. Pat. No. 5,316,967.

FIELD OF THE INVENTION

The present invention relates to a method for producing a semiconductor device in which a GaAs epitaxial layer is regrown on an AlGaAs epitaxial layer patterned by wet etching or the like. The invention also relates to an apparatus for producing such a semiconductor device.

BACKGROUND OF THE INVENTION

FIG. 17(a) is a cross-sectional view showing a prior art ridge waveguide type semiconductor laser device. In FIG. 17(a), reference numeral 400 designates an n type GaAs series semiconductor laser device. An n type AlGaAs first cladding layer 2 is disposed on the n type GaAs substrate 1. A p type AlGaAs active layer 3 is disposed on the n type AlGaAs first cladding layer 2. A p type AlGaAs second cladding layer 4 having a ridge in a reverse mesa shape is disposed on the p type AlGaAs active layer 3. A p type GaAs first cap layer 5 is disposed on the ridge of the second cladding layer 4. An n type GaAs current blocking layer 8 and a p type GaAs second cap layer 50 are disposed at both sides of the ridge. A p type GaAs contact layer 9 is disposed on the p type GaAs second cap layer 50. A p side electrode 10 and an n side electrode 11 are disposed on the p type GaAs contact layer 9 and the rear surface of the n type GaAs substrate 1, respectively. FIG. 17(b) shows an n type GaAs semiconductor laser device having the same structure as the device of FIG. 17(a), in which the p type GaAs contact layer 9 is thicker than that of FIG. 17(a).

A description is given of the production method. FIGS. 18(a)–18(e) illustrate process steps in a method for producing the semiconductor laser shown in FIG. 17(a). Initially, as illustrated in FIG. 18(a), there are successively grown on the n type GaAs substrate 1 the n type AlGaAs first cladding layer 2, the p type AlGaAs active layer 3, the p type AlGaAs second cladding layer 4, and the p type GaAs first cap layer 5 (first epitaxial growth step). Preferably, these layers are grown by metal organic chemical vapor deposition (MOCVD).

Then, as illustrated in FIG. 18(b), an SiN film 6 and a photoresist 7 are successively deposited on the first cap layer 5, and the SiN film 6 is patterned in a stripe shape by conventional photolithographic and selective etching steps.

Then, as illustrated in FIG. 18(c), after removing the photoresist 7, the p type AlGaAs second cladding layer 4 and the p type GaAs first cap layer 5 are selectively removed by wet etching using the SiN film 6 as a mask, leaving a ridge having a reverse mesa shape. The wet etching should be carried out so that the p type AlGaAs second cladding layer 4 remains on the p type AlGaAs active layer 3 at opposite sides of the ridge.

Subsequently, as illustrated in FIG. 18(d), the n type GaAs current blocking layer 8 and the p type GaAs second cap layer 50 are successively grown on the p type AlGaAs second cladding layer 4 to bury the ridge, preferably by MOCVD (second epitaxial growth step).

After removing the SiN film 6, the p type GaAs contact layer 9 is grown on the p type GaAs first cap layer 5 and the p type GaAs second cap layer 50, preferably by MOCVD (third epitaxial growth step). Thereafter, the p side electrode 10 and the n side electrode 11 are formed on the p type GaAs contact layer 9 and the rear surface of the n type GaAs substrate 1, respectively, completing the semiconductor laser device 400 shown in FIG. 18(e). If the p type GaAs contact layer 9 is grown thick in the third epitaxial growth step, the laser structure shown in FIG. 17(b) is obtained.

In operation, when a forward bias voltage is applied across the n type GaAs substrate 1 and the p type GaAs contact layer 9, current flows into the p type AlGaAs active layer 3 through the ridge having a reverse mesa shape and carriers are confined in the p type AlGaAs active layer, resulting in carrier recombinations that produce laser light. At this time, since light absorption and current concentration are caused by the n type GaAs current blocking layer 8, a difference in refractive index along in the horizontal direction of the active layer 3, restricting the extent of the generated light in the transverse direction. Thus guided light resonates in a Fabry-Perot resonator which is constituted by cleavage facets opposite to each other in the longitudinal direction of the stripe-shaped ridge, and laser oscillation occurs.

The conventional ridge waveguide type semiconductor laser device has the following drawbacks.

FIG. 19 is a sketch of an electron microscope photograph illustrating a cross-section of the wafer after the second epitaxial growth step shown in FIG. 18(d). During the selective etching for forming the ridge structure having a reverse mesa shape, portions of the cap layer 5 beneath the ends of the SiN film 6 serving as an etching mask are unfavorably etched away, resulting in over-hanging portions 6a. This is caused by poor adhesion between the etching mask, comprising SiN or the like, and the epitaxially grown layer so that the etchant permeates into the interface between them. If such over-hanging portions 6a are present in the second epitaxial growth step, i.e., the step of successively growing the n type GaAs current blocking layer 8 and the p type GaAs second cap layer 50 on the p type AlGaAs second cladding layer 4, reactive gases do not reach to the over-hanging portions 6a, resulting in an uneven growth that produces hollows 21.

When the SiN film 6 is removed and the p type GaAs contact layer 9 is grown on the first and second cap layers 5 and 50 by the third epitaxial growth, step concave portions are formed on the surface of the contact layer 9. In addition, since the crystal growth is unevenly carried out beneath the over-hanging portions 6a, crystallinity of the p type GaAs contact layer 9 disposed thereon is poor, adversely affecting performance of the semiconductor device. In addition, if concave portions are formed on the p type GaAs contact layer 9, a metal film, serving as a p side electrode 10, is not evenly deposited on the contact layer, resulting in an unreliable device. Especially when the p type GaAs contact layer 9 is thin as shown in FIG. 17(a), the p type GaAs contact layer 9 is unfavorably broken due to the concave portions between the p type GaAs first cap layer 5 on the ridge and the p type GaAs second cap layer 50, and the p side electrode 10 on the contact layer 9 is also broken, resulting in further reduction in reliability of the device.

If crystallinity of the epitaxially grown layer, which is regrown at opposite sides of the ridge, deteriorates, the thickness of the epitaxially grown layer is not even and the ridge unfavorably protrudes. In this state, when the p type GaAs contact layer 9 is formed, a convex portion is formed on the surface of the p type GaAs contact layer 9 and a stress is applied to the ridge in the subsequent steps, such as a step of polishing the rear surface of the substrate, a step of mounting the semiconductor chip on a package with solder while connecting the ridge side to a heat sink (Junction down), and the like, whereby the ridge is damaged. In addition, the convex portion of the contact layer does not adhere closely to the heat sink, causing an inclination of a laser beam produced by the chip.

Meanwhile, Japanese Published Patent Applications Nos. 63-269593 and 1-287980 and Mitsubishi Denki Giho Vol.62, No. 11 (1988), pp.958 to 961 propose ridge waveguide type semiconductor laser devices in which a p type AlGaAs buffer layer or a p type GaAs buffer layer is grown on a p type AlGaAs cladding layer exposed at both sides of a ridge and then an n type GaAs current blocking layer is grown. In these laser devices, since the crystal growth of the p type AlGaAs or GaAs buffer layer smoothly progresses on the p type AlGaAs cladding layer, the crystal layer is grown to some degree beneath the above-described over-hanging portions. However, it is impossible to completely fill up the hollows under the over-hanging portions, so that the above-described problems have not been completely solved yet.

FIG. 21 is a graph showing oxygen concentrations determined by SIMS analysis in the p type AlGaAs second cladding layer 4 and the n type GaAs current blocking layer 8 Produced in the process steps shown in FIGS. 18(a)-18(e). Since the surface of the p type AlGaAs second cladding layer 4 is exposed to the atmosphere during the etching for forming the ridge, much oxygen exists on the surface of the cladding layer 4. As the result, an interface level is produced between the cladding layer 4 and the current blocking layer 8 in a completed device, and leakage current is generated in this region, deteriorating characteristics of the device.

When the ridge is formed by wet etching, fine grooves are formed on the exposed surface of the p type AlGaAs second cladding layer 4. The depth of each groove is equal to a thickness of several atom layers, i.e., 10 to 20 angstroms. When the n type GaAs current blocking layer 8 is epitaxially grown on the p type AlGaAs second cladding layer 4, since the n type GaAs does not favorably match with the p type AlGaAs, the grooves also appear on the surface of the n type GaAs current blocking layer 8, whereby crystallinity of the current blocking layer 8 deteriorates, resulting in deterioration in the device characteristics.

As a solution of the above-described problem, there is a method for producing a ridge waveguide type semiconductor laser device disclosed in Japanese Published Patent Application No. 64-84780. In this method, after a ridge is formed by wet etching, the surface of a first semiconductor layer exposed at both sides of the ridge is etched by vapor phase etching in a reaction tube, and a second semiconductor layer is grown on the first semiconductor layer in the same reaction tube. In this case, although the concentration of oxygen on the crystal surface is reduced and the grooves generated on the crystal surface due to the wet etching are decreased, since the vapor phase etching and the crystal growth are carried out in the same reaction tube, reaction products of the vapor phase etching adversely affect the crystal growth, resulting in poor crystallinity of the grown layer.

FIGS. 20(a)-20(c) are cross-sectional views of process steps in a method for dividing a semiconductor substrate, on which a plurality of p type InP ridge waveguide semiconductor laser elements are disposed, into a plurality of semiconductor laser devices. In the figures, semiconductor laser elements 19 and 20 are adjacent to each other on a p type InP substrate 12. In each semiconductor element, a ridge 22 is formed in the substrate 12 and an undoped InGaAsP active layer 14 is formed in the ridge 22. An InP epitaxial layer 13 is disposed on the p type InP substrate 12 at opposite sides of the ridge 22. An $SiO_2$ film 15 is disposed on the entire surface except for the center of the top surface of the ridge 22. An n side electrode 16 is disposed on the ridge 22 and the $SiO_2$ film 15. Reference numeral 18 designates an interface between the p type InP substrate 12 and the InP epitaxial layer 13 and numeral 17a (17b) designates a photoresist.

First of all, as illustrated in FIG. 20(a), a photoresist 17a is deposited on the entire surface of the p type InP substrate 12, on which the semiconductor elements 19 and 20 are present, and patterned to form a stripe groove approximately 5 microns wide between the elements 19 and 20. Then, using the photoresist 17a as a mask, the $SiO_2$ film 15 is etched away to expose the surface of the epitaxial layer 13.

Then, as illustrated in FIG. 20(b), using the $SiO_2$ film 15 as a mask, the InP substrate 12 and the epitaxial layer 13 are wet etched using an etchant including hydrochloric acid to form a groove 21 deeper than the interface 18. In this case, over-hanging portions 15a about 2 microns wide are formed on both ends of the groove 23 because of the side etching of the layers 12 and 13. If the wafer is divided without removing the over-hanging portions 15a, $SiO_2$ powder is provided and adheres to the pn-junction exposed on the cleavage plane of the separated element, causing a leakage current. Or, the over-hanging portions of the $SiO_2$ film 15 come off, adversely affecting the characteristics and reliability of the laser device.

In order to avoid this problem, the over-hanging portions 15a may be removed before the division of the wafer. More specifically, after removing the photoresist 17a, a photoresist 17b is deposited on the entire surface of the wafer and patterned to form an aperture of approximately 30 microns width above the groove 21. Using the photoresist 17b as a mask, the over-hanging portions 15a of the $SiO_2$ film 15 are etched away by an etchant including HF as shown in FIG. 20(c). Finally, the p type InP substrate 12 is cut along the groove 21 to separate the semiconductor laser elements 19 and 20 from each other.

In this method, however, the step of removing the over-hanging portions 15a is very complicated. In addition, since it is difficult to precisely remove only the over-hanging portions 15a, the end surface of the InP epitaxial layer 13 is unfavorably exposed, resulting in deterioration in the device characteristics.

SUMMARY OF THE INVENTION

An object of the present invention is to provide a method for producing a semiconductor device in which a ridge in a reverse mesa shape is formed by removing portions of a first semiconductor epitaxially grown layer by wet etching and then a second semiconductor layer is epitaxially grown on opposite sides of the ridge without generating concave portions in the semiconductor layer.

Another object of the present invention is to provide a method for producing a semiconductor device in which a ridge in a reverse mesa shape is formed by removing portions of epitaxially grown layers, including an AlGaAs layer, by wet etching and then a GaAs layer with good crystallinity is epitaxially grown on the AlGaAs layer exposed at both sides of the ridge without generating concave portions in the GaAs layer.

Still another object of the present invention is to provide a method for producing a semiconductor device in which a ridge in a reverse mesa shape is formed by removing portions of a first semiconductor epitaxially grown layer by wet etching and then a second semiconductor layer is epitaxially grown at both sides of the ridge and, thereafter, a third semiconductor layer is epitaxially grown, with a flat surface, on the ridge and the first semiconductor layer.

Yet another object of the present invention is to provide a method for producing a semiconductor device in which, when a plurality of semiconductor elements disposed on the same semiconductor substrate are separated from each other, over-hanging portions of an insulating film, which hang over a groove along which the substrate is cut, are easily removed.

A further object of the present invention is to provide a semiconductor device including a first semiconductor epitaxial layer having a ridge in a reverse mesa shape, a second semiconductor epitaxial layer disposed at opposite sides of the ridge, a third semiconductor epitaxial layer disposed on the ridge and the second semiconductor layer, and an electrode evenly and reliably adhered to the third semiconductor layer.

A still further object of the present invention is to provide a method of and an apparatus for producing a semiconductor device in which a surface of a semiconductor layer including AlGaAs or the like, on which fine grooves are formed by wet etching or oxygen, is cleansed and then a semiconductor layer including GaAs or the like is successively grown on the clean surface.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, in a method for producing a semiconductor device, a ridge in a reverse mesa shape is formed by removing portions of a first semiconductor layer by wet etching using an insulating film pattern as a mask, both ends of the insulating film pattern, being etched to approximate the width of the ridge, a second semiconductor layer is epitaxially grown on opposite sides of the ridge using the insulating film pattern as a mask for the crystal growth, and a third semiconductor layer is epitaxially grown on the substrate. Therefore, the second semiconductor layer is grown without concave portions at the opposite sides of the ridge.

According to a second aspect of the present invention, after approximating the width of the mask pattern to the width of the ridge by etching away the both ends of the mask pattern, the ridge is lightly etched. Then, a semiconductor layer is epitaxially grown on the both sides of the ridge. Therefore, the semiconductor layer is grown without concave portions at the opposite sides of the ridge.

According to a third aspect of the present invention, a mask pattern, which is used when a ridge is formed by removing prescribed portions of a first semiconductor layer by wet etching and a second semiconductor layer is epitaxially grown on opposite sides of the ridge, is previously formed on the first semiconductor layer so that the width of the mask pattern may be reduced to a prescribed width after the ridge is formed. When the ridge is formed by wet etching, the etching is carried out so that the width of the ridge is equal to the prescribed width of the mask pattern. Thereafter, the width of the mask pattern is reduced and the second semiconductor layer is epitaxially grown. Therefore, the second semiconductor layer is grown without concave portions at the opposite sides of the ridge.

According to a fourth aspect of the present invention, a mask pattern, which is used when a ridge is formed by removing prescribed portions of a first semiconductor layer by wet etching and a second semiconductor layer is epitaxially grown on opposite sides of the ridge, is formed of a semiconductor epitaxial layer. Therefore, the etchant does not permeate into boundary between the mask pattern and the first semiconductor layer, preventing side etching of the ridge beneath the mask pattern.

According to a fifth aspect of the present invention, when a ridge is formed by removing prescribed portions of a first semiconductor layer by wet etching and a second semiconductor layer is epitaxially grown on opposite sides of the ridge, the thickness of the second semiconductor layer is in a range of ±0.3 micron plus the height of the ridge. Therefore, the second semiconductor layer is grown without concave portions at the opposite sides of the ridge.

According to a sixth aspect of the present invention, a ridge is formed by removing prescribed portions of semiconductor epitaxial layers including an AlGaAs layer by wet etching, an $Al_xGa_{1-x}As$ low temperature buffer layer ($0 < X \leq 1$) is grown on the AlGaAs layer exposed at opposite sides of the ridge at a temperature lower than a growth temperature of a GaAs layer, and a GaAs layer is epitaxially grown on the low temperature buffer layer. Therefore, amorphous AlGaAs grows on rear surfaces of over-hanging portions of a mask pattern and fills up fine grooves on the surface of the AlGaAs layer exposed at opposite sides of the ridge, whereby concave portions beneath the over-hanging portions are reduced and the surface of the AlGaAs layer is smooth. Therefore, the GaAs layer is evenly and reliably grown without concave portions at opposite sides of the ridge.

According to a seventh aspect of the present invention, a ridge is formed by removing prescribed portions of semiconductor epitaxial layers including an AlGaAs layer by wet etching, a superlattice buffer layer is grown on the AlGaAs layer exposed at opposite sides of the ridge, and a GaAs layer is epitaxially grown on the low temperature buffer layer. Therefore, dislocations between the AlGaAs layer and the superlattice buffer layer spread in the transverse direction through the superlattice buffer layer, so that the device is not affected by localized oxygen and fine grooves on the surface of the AlGaAs layer. AS the result, the GaAs layer is evenly and reliably grown without concave portions at opposite sides of the ridge.

According to a eighth aspect of the present invention, when a ridge is formed by removing prescribed portions of semiconductor epitaxial layers including an AlGaAs layer by wet etching and then a GaAs layer is epitaxially grown on the AlGaAs layer exposed at opposite sides of the ridge, the growth of the GaAs layer is once stopped in an initial stage of the growth. Therefore, rearrangement of the GaAs crystal is enhanced so that the GaAs crystal a monocrystalline, so that the GaAs layer is evenly and reliably grown without concave portions at opposite sides of the ridge.

According to a ninth aspect of the present invention, a ridge is formed by removing prescribed portions of semiconductor epitaxial layers including an AlGaAs layer by wet etching, the surface of the AlGaAs layer exposed at opposite sides of the ridge is dry etched, and a GaAs layer is epitaxially grown on the AlGaAs layer without exposing the surface of the AlGaAs layer to the atmosphere. Therefore, the AlGaAs layer is not affected by reaction products of the etching process, so that the GaAs layer is grown on the clean surface of the AlGaAs layer.

According to a tenth aspect of the present invention, a semiconductor layer is epitaxially grown on a semiconductor substrate, a plurality of semiconductor elements are formed in prescribed regions of the semiconductor layer and the semiconductor substrate, and a photoresist pattern having a plurality of apertures is formed on the substrate. The apertures of the photoresist pattern are positioned on regions between adjacent semiconductor elements. Then, apertures of an insulating film, which is disposed beneath the photoresist pattern, are formed using the photoresist pattern as a mask, and portions of the semiconductor layer and the semiconductor substrate are removed by wet etching using the insulating film as a mask to form grooves deeper than a boundary between the semiconductor layer and the semiconductor substrate. Then, over-hanging portions of the insulating film above the grooves are removed by plasma etching using the photoresist pattern as a mask. Finally, the semiconductor substrate is separated along the grooves, resulting in a plurality of semiconductor chips. Therefore, highly-reliable semiconductor chips are produced in a simple, highly repeatable process.

According to an eleventh aspect of the present invention, a semiconductor laser device includes a ridge in a reverse mesa shape formed by patterning semiconductor epitaxial layers including an AlGaAs layer, an $Al_xGa_{1-x}As$ low temperature buffer layer ($0 \leq X \leq 1$) grown on the AlGaAs layer exposed at opposite sides of the ridge, and a second semiconductor layer epitaxially grown on the low temperature buffer layer.

According to a twelfth aspect of the present invention, a semiconductor laser device includes a ridge in a reverse mesa shape formed by patterning semiconductor epitaxial layers including an AlGaAs layer, a superlattice buffer layer grown on the AlGaAs layer exposed at opposite sides of the ridge, and a second semiconductor layer epitaxially grown on the superlattice buffer layer.

According to a thirteenth aspect of the present invention, an apparatus for producing a semiconductor device includes an MOCVD chamber in which a compound semiconductor crystal having a prescribed composition is grown on a semiconductor substrate, an etching chamber for dry etching, and an wafer conveyer for automatically conveying the semiconductor substrate under hydrogen atmosphere or vacuum between the chambers. The wafer conveyer is disposed between the MOCVD chamber and the etching chamber.

BRIEF DESCRIPTION OF THE DRAWINGS

FIGS. 14(a)–14(e) are cross-sectional views illustrating process steps in a method for producing a semiconductor device in accordance with a seventh embodiment of the present invention;

DETAILED DESCRIPTION OF THE PREFERRED EMBODIMENTS

Figure 1:
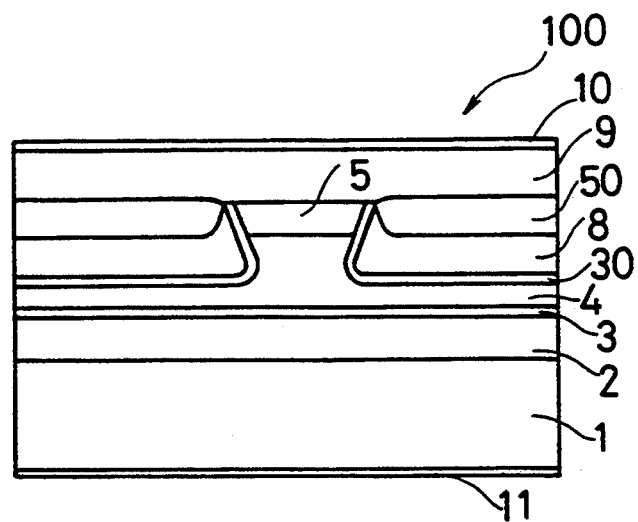
FIG. 1 is a cross-sectional view of a semiconductor laser device according to a first embodiment of the present invention.

FIG. 1 is a cross-sectional view of a semiconductor laser device in accordance with a first embodiment of the present invention. In FIG. 1, reference numeral 1 designates an n type GaAs substrate. An n type AlGaAs first cladding layer 2 is disposed on the substrate 1. A p type AlGaAs active layer 3 is disposed on the n type AlGaAs first cladding layer 2. An n type AlGaAs second cladding layer 4 is disposed on the p type AlGaAs active layer 3. A p type GaAs first cap layer 5 is disposed on the n type AlGaAs second cladding layer 4. A part of the n type AlGaAs second cladding layer 4 and the p type GaAs first cap layer 5 form a ridge having a reverse mesa shape. A p type AlGaAs low temperature buffer layer 30 is disposed on the n type AlGaAs second cladding layer 4 and side surfaces of the ridge. An n type GaAs current blocking layer 8 and a p type GaAs second cap layer 50 are successively disposed on the low temperature buffer layer 30 to bury the ridge. A p type GaAs contact layer 9 is disposed on the p type GaAs first and second cap layers 5 and 50. A p side electrode 10 and an n side electrode 11 are disposed on the p type GaAs contact layer 9 and the rear surface of the n type GaAs substrate 1, respectively.

A method of making the semiconductor laser structure of FIG. 1 is illustrated in FIGS. 4(a)–4(f).

Figure 4:
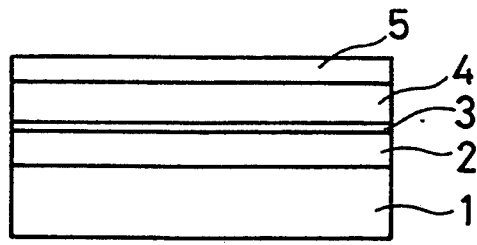
FIGS. 4(a)–4(f) are cross-sectional views illustrating process steps in a method of producing the semiconductor laser device of FIG. 1.
Figure 4:
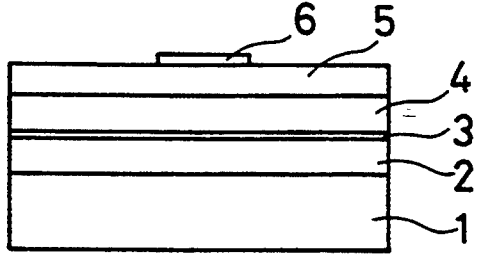
Figure 4:
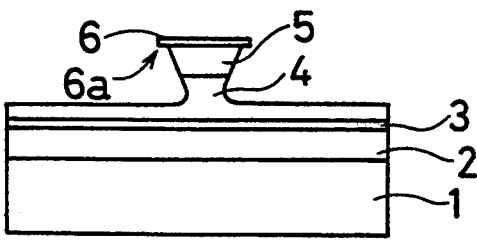
Figure 4:
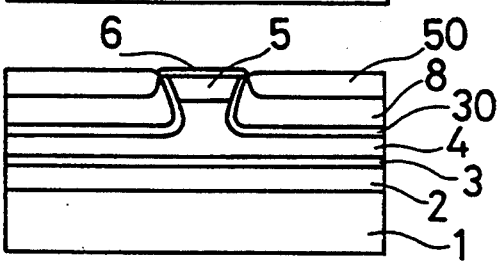
Figure 4:
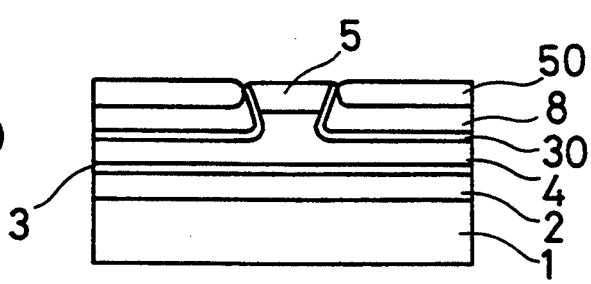
Figure 4:
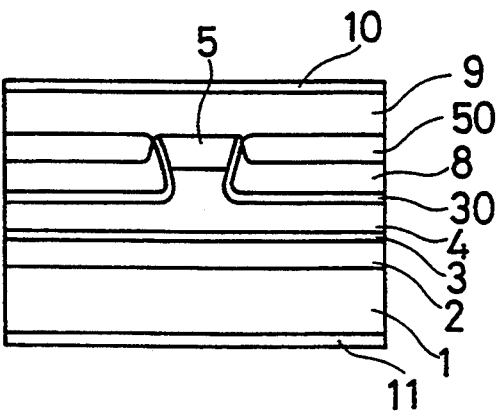

Initially, as illustrated in FIG. 4(a), there are successively grown on the n type GaAs substrate 1 having a thickness of 1 micron the n type AlGaAs first cladding layer 2 to a thickness of 1.5 micron, the p type AlGaAs active layer 3 to a thickness of 0.05 micron, the p type AlGaAs second cladding layer 4 to a thickness of 1.5 micron, and a p type GaAs second cap layer 5 to a thickness of 0.5 micron. Preferably, these layers are grown at about 750° C. by MOCVD.

Then, an SiN film is deposited on the p type GaAs first cap layer 5 to a thickness of about 1000 angstroms by thermal CVD, and a photoresist is deposited on the SiN film and patterned in a stripe shape having a width of 6 to 8 microns by conventional photolithographic and etching steps. Then, using the photoresist as a mask, the SiN film is etched away by a mixed gas of CF$_4$ and O$_2$ until the surface of the p type GaAs first cap layer 5 is exposed. Then, the photoresist is removed, resulting in the SiN film 6 shown in FIG. 4(b).

Subsequently, using the SiN film 6 as a mask, the p type GaAs first cap layer 5 and the p type AlGaAs second cladding layer 4 are etched by an etchant comprising sulfuric acid, hydrogen peroxide, and water, leaving the p type AlGaAs second cladding layer 4 0.2 to 0.3 micron thick on the active layer 3, resulting in the ridge shown in FIG. 4(c). At this time, since the etching progresses under the SiN film 6, an over-hanging portion 6a of about 0.8 micron wide is formed at each end of the SiN film 6.

Then, the GaAs low temperature buffer layer 30 about 500 angstroms thick is grown on the p type AlGaAs second cladding layer 4 while reducing the temperature of the substrate to 450° C. Then, the temperature of the substrate is raised up to 750° C. to carry out a thermal cleaning. During the growth of the GaAs low temperature buffer layer 30, amorphous Ga and As atoms evenly adhere to the p type AlGaAs second cladding layer 4 and the p type GaAs first cap layer 5, whereby the side walls of the ridge and the rear surfaces of the over-hanging portions 6a are covered and the fine grooves on the p type AlGaAs upper cladding layer 4 caused by the wet etching are filled up. In addition, during the thermal cleaning at 750° C., rearrangement of the amorphous Ga and As atoms occurs, whereby the GaAs low temperature buffer layer 30 becomes a monocrystalline GaAs layer with a uniform composition. The thermal cleaning is carried out for 20 minutes.

Figure 8:
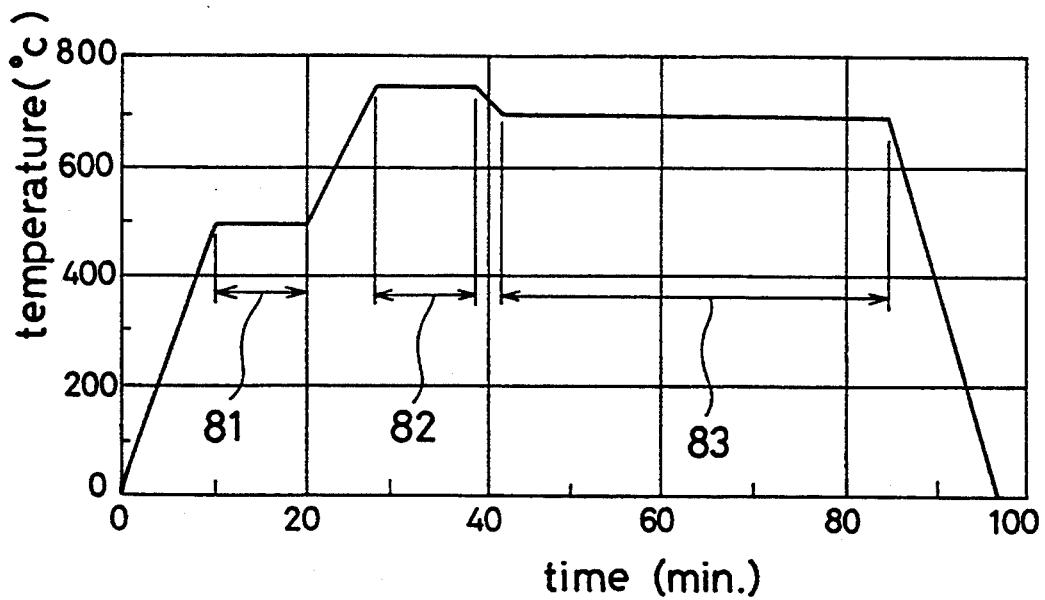
FIG. 8 is a graph illustrating the relation between a substrate temperature and reaction time in the step of growing a GaAs low-temperature buffer layer, an n type GaAs current blocking layer, and a p type GaAs second cap layer in the method shown in FIGS. 4(a)–4(f)

Thereafter, the temperature of the substrate is lowered to 700° C. that is a usual growth temperature of GaAs, and the n type GaAs current blocking layer 8 and the p type GaAs second cap layer 50 are successively grown on the buffer layer 30 as shown FIG. 4(d). At this time, since these layers are grown on the GaAs low temperature buffer layer 30 having improved crystallinity, crystallinities of these layers are significantly improved. FIG. 8 shows a temperature profile used in the above-described growth process, in which reference numeral 81 shows a period for growing the low temperature buffer layer, numeral 82 shows a period for the thermal cleaning, and numeral 83 shows a period for growing the current blocking layer 8 and the second cap layer 50.

Thereafter, as shown in FIG. 4(e), the SiN film 6 is removed by plasma etching, and a p type GaAs contact layer 9 about 2.5 microns thick is grown by MOCVD at about 750° C. Thereafter, a p side electrode 10 and an n side electrode 11 are formed on the p type GaAs contact layer 9 and the rear surface of the substrate 1, respectively, resulting in a semiconductor laser device shown in FIG. 4(f).

According to the first embodiment of the present invention, when the GaAs low temperature buffer layer 30 is grown on the surface of the p type AlGaAs second cladding layer 4, amorphous GaAs adheres to the side walls of the ridge and the rear surfaces of the over-hanging portions 6a, whereby the rear surfaces of the over-hanging portions 6a are covered with the buffer layer 30. In addition, the amorphous GaAs fills up the fine grooves on the p type AlGaAs second cladding layer 4. Since the GaAs low temperature buffer layer 30 is changed to a monocrystalline layer by the thermal cleaning, crystallinities of the n type GaAs current blocking layer 8 and the p type GaAs second cap layer 50, which are epitaxially grown on the low temperature buffer layer 30, are improved. Therefore, the side walls of the ridge are buried by the epitaxially grown layers 8 and 50 without generating concave portions at opposite sides of the ridge, so that crystallinity of the p type GaAs contact layer grown on the cap layers 5 and 50 is improved and the p side electrode 10 is evenly and reliably connected to the surface of the p type GaAs contact layer. As the result, a semiconductor laser device with high performance and high reliability is achieved.

While in the above-described first embodiment the GaAs low temperature buffer layer 30 is 500 angstroms thick, the same effects as described above are obtained when the buffer layer 30 is 200~1000 angstroms thick.

While in the above-described first embodiment the growth temperature of the buffer layer 30 is 400° C., it may be controlled within a range of 300° C.~550° C. Especially, a growth temperature of 350° C.~450° C. provides the most favorable result.

While in the above-described first embodiment the GaAs low temperature buffer layer is employed, an AlGaAs low temperature buffer layer may be employed with the same effects as described above.

Figure 2:
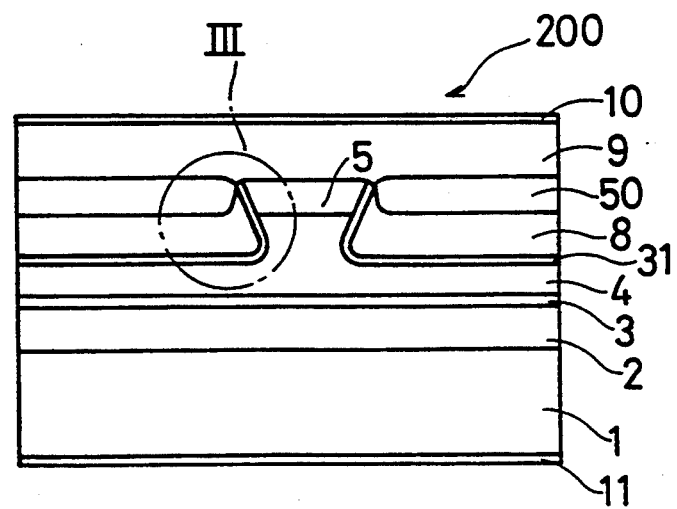
FIG. 2 is a cross-sectional view of a semiconductor laser device according to a second embodiment of the present invention.
Figure 3:
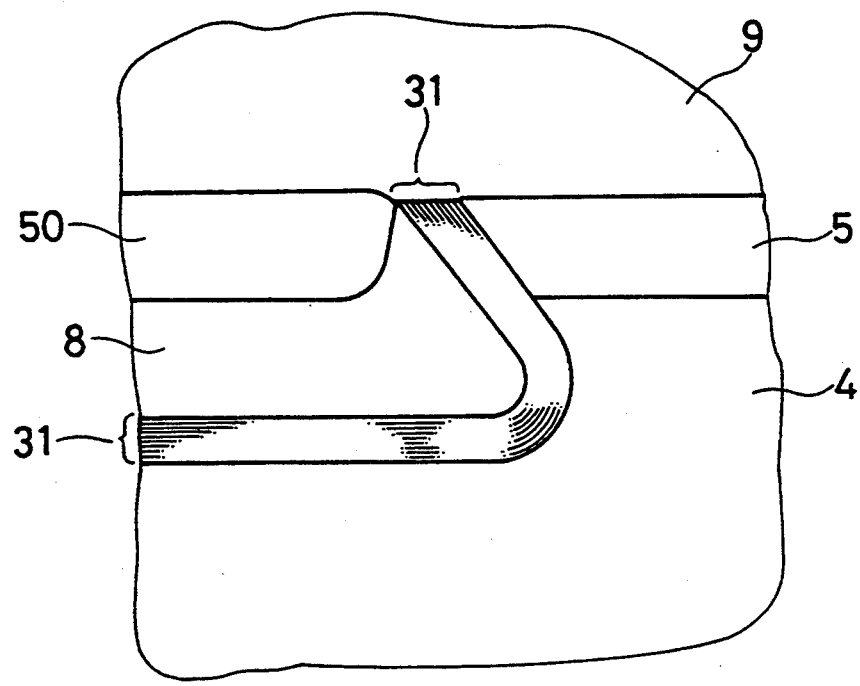
FIG. 3 is a sketch of an electron microscope photograph illustrating an enlarged view of a portion of the semiconductor laser shown in FIG. 2.

FIG. 2 is a cross-sectional view showing a semiconductor laser device in accordance with a second embodiment of the present invention and FIG. 3 is an enlarged view of a portion III of FIG. 2. In these figures, the same reference numerals as in FIG. 1 designate the same or corresponding parts. In this second embodiment, a superlattice buffer layer 31, in which five 200 angstroms thick AlGaAs layers and five 500 angstroms thick GaAs layers are alternatingly laminated, is employed instead of the GaAs low temperature buffer layer 30 of the first embodiment.

In production, the 200 angstroms AlGaAs layer and the 500 angstroms GaAs layer are alternatingly grown five times on the p type AlGaAs second cladding layer 4 at 700° C. Since the 200 angstroms AlGaAs layer at the bottom of the laminate has the same composition as the p type AlGaAs second cladding layer 4, these layers favorably adhere to each other, and the superlattice buffer layer 31 is grown beneath the over-hanging portions 6a of the SiN film 6. In addition, dislocations between the p type AlGaAs second cladding layer 4 and the superlattice buffer layer 31 spread in the transverse direction through the superlattice buffer layer 31, so that the n type GaAs current blocking layer 8 and the p type GaAs second cap layer 50 are epitaxially grown on the superlattice buffer layer 31 without adverse influence from the localized oxygen and the fine grooves on the surface of the p type AlGaAs upper cladding layer 4. In addition, these layers 8 and 50 are epitaxially grown with good crystallinity without generating concave portions at the both sides of the ridge, whereby the p type GaAs contact layer 9 is evenly grown with good crystallinity on these layers, and the p side electrode 10 evenly and reliably connects to the surface of the p type GaAs contact layer. As the result, a semiconductor laser device with high performance and high reliability is achieved.

Figure 5:
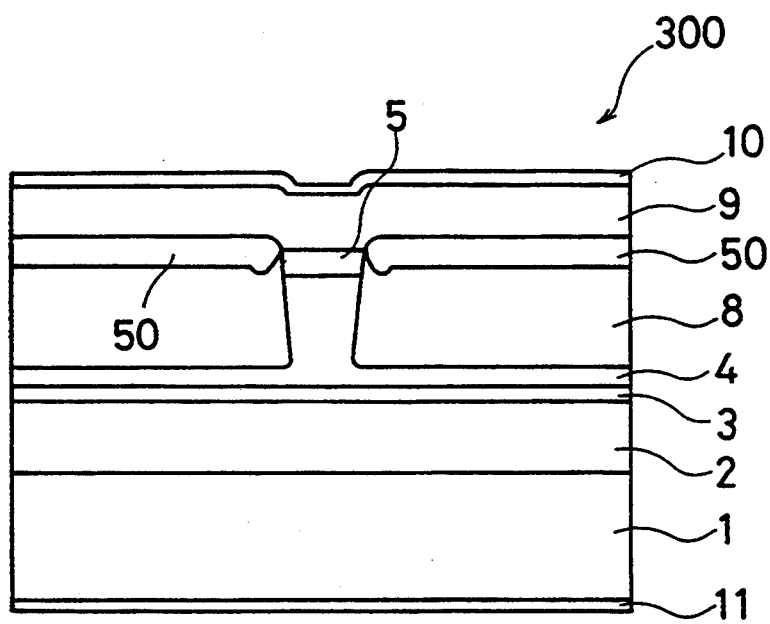
FIG. 5 is a cross-sectional view of a semiconductor laser device according to a third embodiment of the present invention.

FIG. 5 is a cross-sectional view showing a semiconductor laser device in accordance with a third embodiment of the present invention. FIGS. 6(a)-6(f) are cross-sectional views of steps in a method for producing the semiconductor laser device of FIG. 5. In these figures, the same reference numerals as in FIG. 1 designate the same or corresponding parts. Reference numeral 300 designates a semiconductor laser device and reference numeral 7 designates a photoresist.

The production method will be described.

Figure 6A:
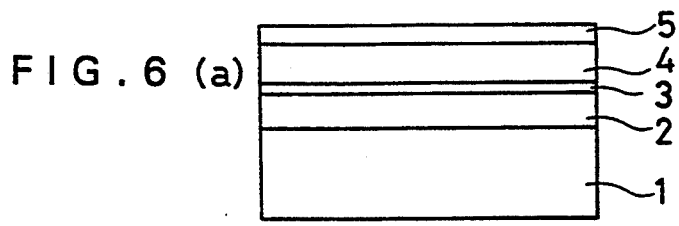
FIGS. 6(a)–6(f) are cross-sectional views illustrating process steps in a method of producing the semiconductor laser device of FIG. 5.
Figure 6B:
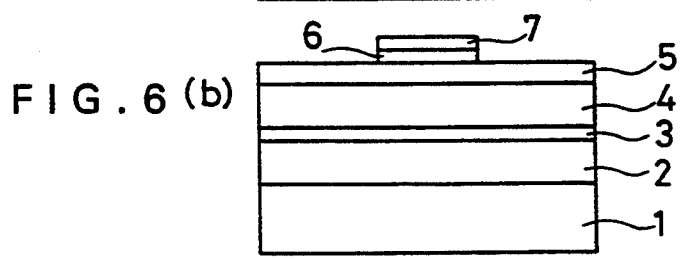
Figure 6C:
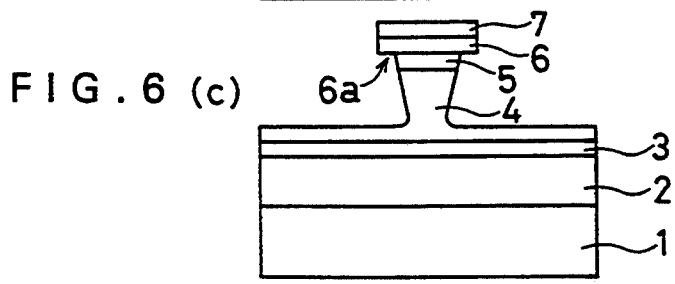
Figure 6D:
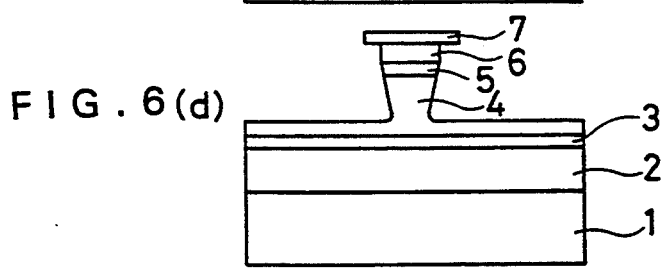
Figure 6E:
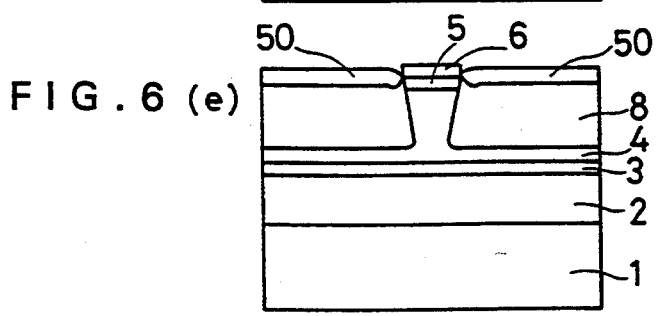
Figure 6F:
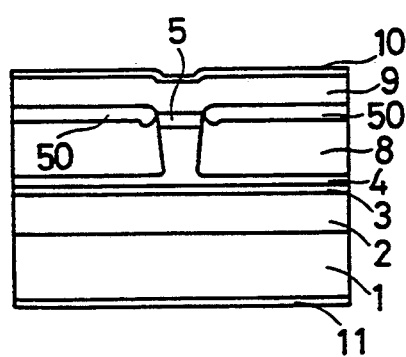

The step of FIG. 6(a) is identical to the step of FIG. 4(a) of the first embodiment, so that description thereof will be omitted. In FIG. 6(b), the SiN film 6 is patterned on the p type GaAs first cap layer 5 using the photoresist 7 in the same manner as described in the first embodiment. In this second embodiment, however, the photoresist 7 is not removed in this step. Then, using the SiN film 6 and the photoresist 7 as a mask, the p type GaAs first cap layer 5 and the p type AlGaAs second cladding layer 4 are etched away in the same manner as described in the first embodiment, leaving a ridge shown in FIG. 6(c). Then, as shown in FIG. 6(d), over-hanging portions 6a of the SiN film 6 are removed by plasma etching using CF$_4$ gas, using the photoresist 7 as a mask. Then, as shown in FIG. 6(e), the photoresist 7 is removed and an n type GaAs current blocking layer 8 about 1.0 micron thick and a p type GaAs second cap layer 50 about 0.5 micron thick are grown on opposite sides of the ridge by MOCVD while keeping the temperature of the substrate at 750° C. Then, the SiN film 6 is removed by plasma etching using a mixed gas comprising CF$_4$ and O$_2$. Thereafter, a p type GaAs contact layer 9 about 2.5 microns thick is grown on the cap layers 5 and 50 by MOCVD. Thereafter, an n side electrode 11 and a p side electrode 10 are formed on the rear surface of the substrate 1 and the p type GaAs contact layer 9, respectively, resulting in a semiconductor laser device shown in FIG. 6(f).

Figure 17A:
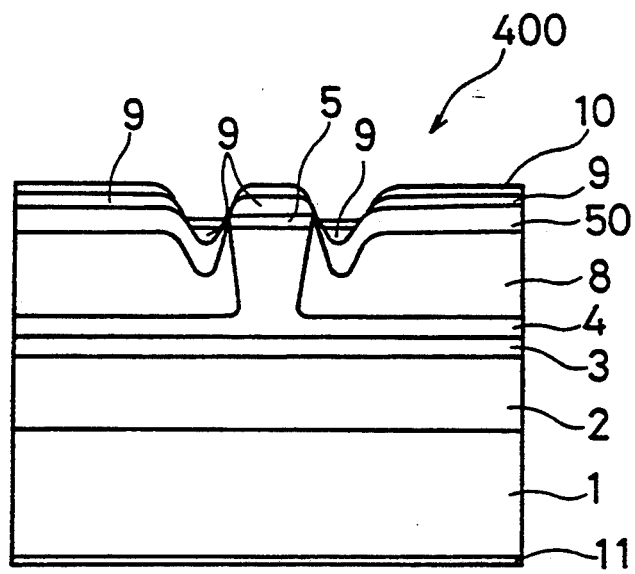
FIGS. 17(a) and 17(b) are cross-sectional views illustrating semiconductor laser devices according to the prior art.
Figure 17B:
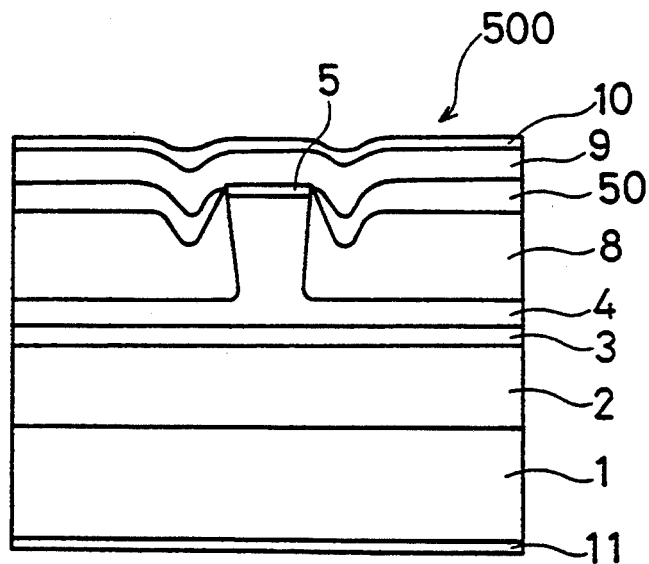
Figure 18A:
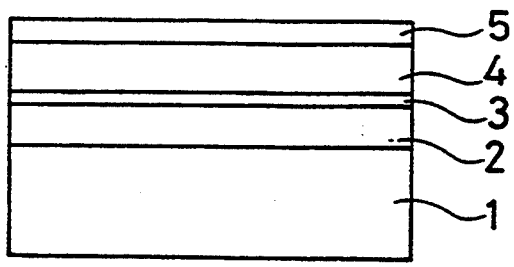
FIGS. 18(a)–18(e) are cross-sectional views illustrating process steps in a method for producing the semiconductor laser device of FIG. 17(a)
Figure 18B:
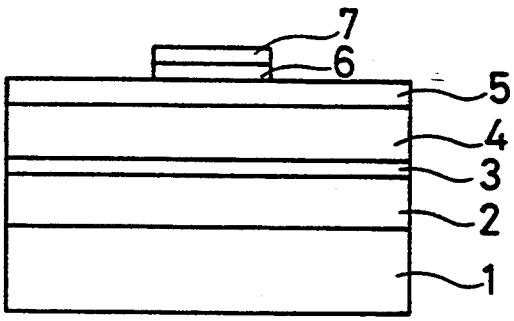
Figure 18C:
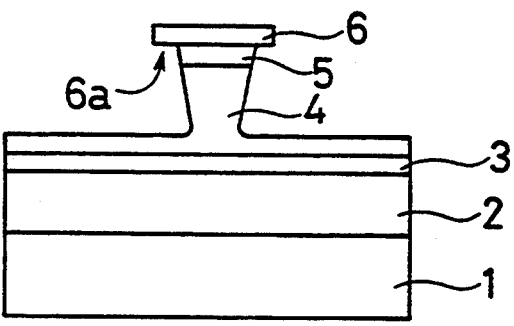
Figure 18D:
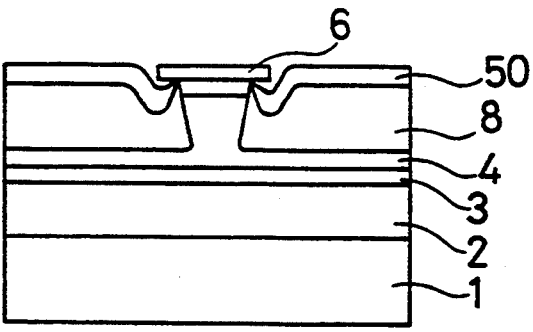
Figure 18E:
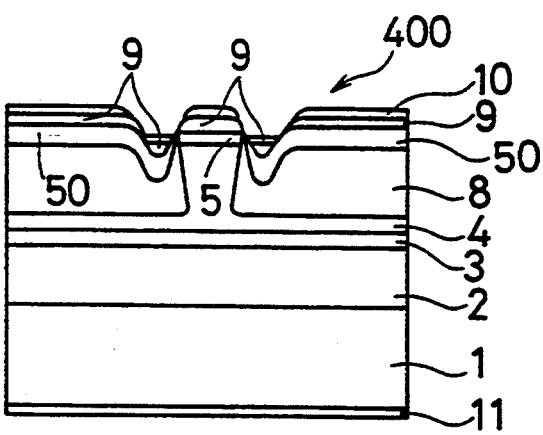
Figure 19:
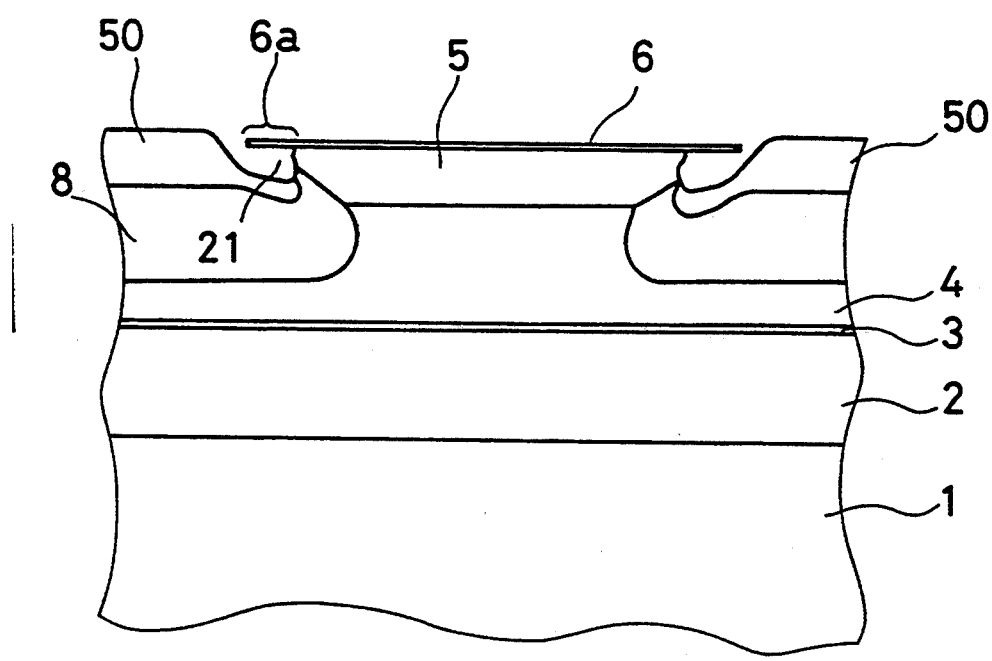
FIG. 19 is a sketch of an electron microscope photograph illustrating a cross-section of a wafer after second epitaxial growth step of FIG. 18(d)

The semiconductor laser device fabricated as described above has the same structure as the conventional laser device shown in FIG. 17. However, in this second embodiment of the present invention, large hollows like shown in FIG. 17 are not formed in the n type GaAs current blocking layer 8 and the p type GaAs second cap layer 50.

According to the second embodiment of the present invention, the over-hanging portions 6a of the SiN film 6 formed in the step of patterning the ridge are removed by plasma etching and then the n type GaAs current blocking layer 8 and the p type GaAs second cap layer 50 are epitaxially grown on opposite sides of the ridge. Therefore, the supply of source gases is smoothly and uniformly carried out during the crystal growth, so that the current blocking layer 8 and the second cap layer 50 are grown on the both sides of the ridge without generating concave portions. In addition, the p type GaAs contact layer 9 is evenly grown on these layers, and the p side electrode 10 evenly and reliably connects to the surface of the p type GaAs contact layer. As the result, a semiconductor laser device with high performance and high reliability is produced with high reproducibility.

Figure 7:
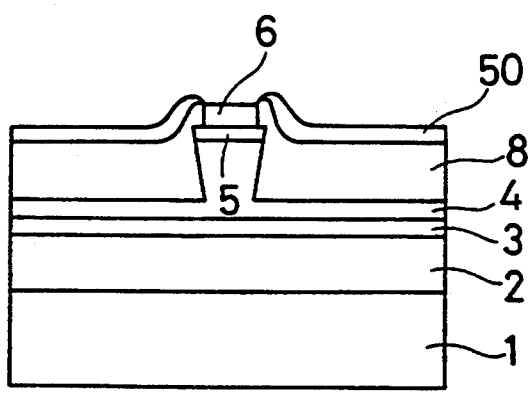
FIG. 7 is a cross-sectional view for explaining a problem caused by an excess etching of a SiN film in the step of FIG. 6(d)

FIG. 7 is a cross-sectional view showing a structure in case where the etching of the over-hanging portions excessively advances until the surface of the first cap layer 5 is exposed at both ends of the ridge, and the n type GaAs current blocking layer 8 and the p type GaAs cap layer 50 are grown on both sides of the ridge. In this case, projections are unfavorably formed on the cap layer 50, causing unevenness of the p type GaAs contact layer 9. In order to avoid this problem, after the etching of the over-hanging portions 6a, the side walls of the ridge are lightly etched by wet etching using an etchant of tartaric acid, sulfuric acid, or phosphoric acid to reduce the width of the ridge by about 0.1 micron. In this case, the surface of the p type GaAs contact layer 9 is further flattened, resulting in a semiconductor laser device with higher reliability.

Figure 10:
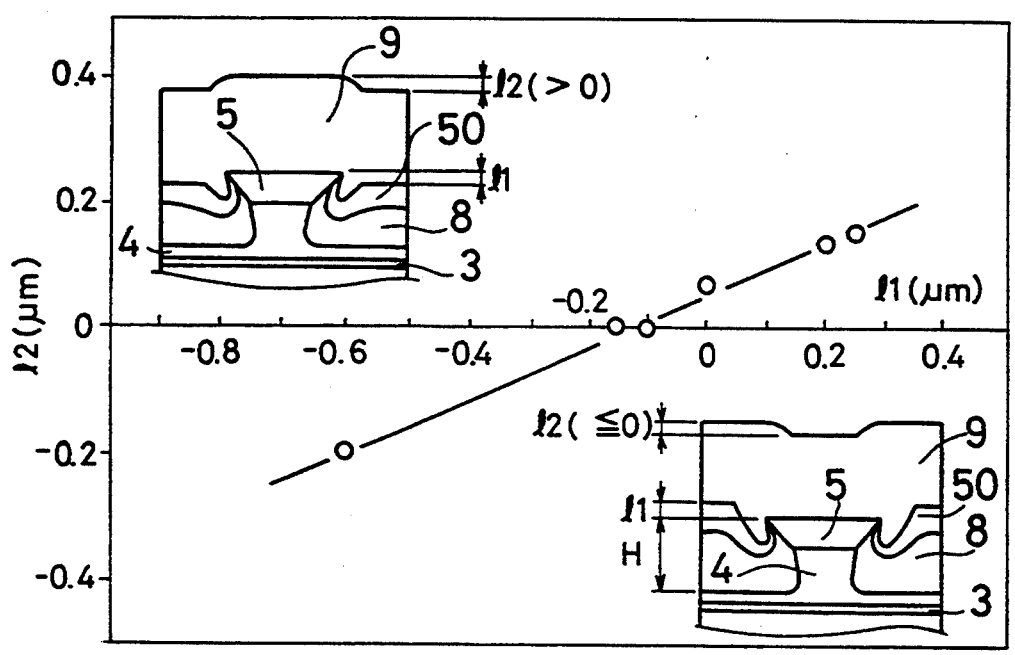
FIG. 10 is a diagram illustrating the relation between a difference in levels between a ridge and semiconductor layers grown on both sides of the ridge and on a contact layer disposed on the ridge and the semiconductor layers.

A description is given of a method for producing a semiconductor laser device in accordance with a fourth embodiment of the present invention. FIG. 10 is a diagram illustrating a relation between a difference in levels between a ridge and semiconductor layers grown on both sides of the ridge and the difference in level of a contact layer disposed on the ridge and the semiconductor layers. In FIG. 10, the same reference numerals as in FIG. 1 designate the same or corresponding parts, Reference character $l_1$ shows the difference in levels between the ridge and the p type GaAs second cap layer 50. Reference character $l_2$ shows a difference in levels of the p type GaAs contact layer 9. The difference $l_1$ is plotted on the abscissa while the difference $l_2$ is plotted on the ordinate.

Meanwhile, if a large convex portion is present on the surface of the contact layer, a metal electrode does not reliably adhere to the contact layer. In addition, stress is applied to the ridge while polishing the rear surface of the substrate or while carrying out a junction down fabrication. As the result, the ridge is damaged and the laser beam is unfavorably inclined, reducing the reliability of the laser device. On the other hand, the difference in level $l_2$ is reduced as the thickness of the contact layer increases. However, the stress applied to the ridge increases with the increase in thickness of the contact layer. Therefore, the thickness of the contact layer is usually 1~3 microns in view of the cost or the like.

In this fourth embodiment of the present invention, the thicknesses of the semiconductor layers grown on opposite sides of the ridge are controlled on the basis of the level of the ridge so that the difference in level $l_2$ of the contact layer maybe ±0.1 micron when the contact layer is 1~3 microns thick. More specifically, when the n type GaAs current blocking layer 8 and the p type GaAs second cap layer 50 are grown on both sides of the ridge, the growth is controlled so that a difference between a total thickness of these layers and the height of the ridge may be ±0.3 micron, and then the p type GaAs contact layer 9 is grown to 1~3 microns, whereby the unevenness on the surface of the contact layer 9 is kept within ±0.1 micron. Therefore, the stress applied to the ridge decreases and an electrode is connected to the contact layer 9 with high reliability.

FIGS. 11(a) to 11(e) are cross-sectional views of steps in a method for producing a semiconductor laser device in accordance with a fifth embodiment of the present invention. In FIGS. 11(a)–11(e), the same reference numerals as in FIG. 1 designate the same or corresponding parts. Reference numeral 3a designates an active layer including a multi quantum well structure, numeral 22 designates an n type GaAs buffer layer, numeral 23 designates an AlAs layer, numeral 24 designates an $Al_{0.8}Ga_{0.2}As$ cap layer, and numeral 29 designates a resist pattern.

Figure 11:
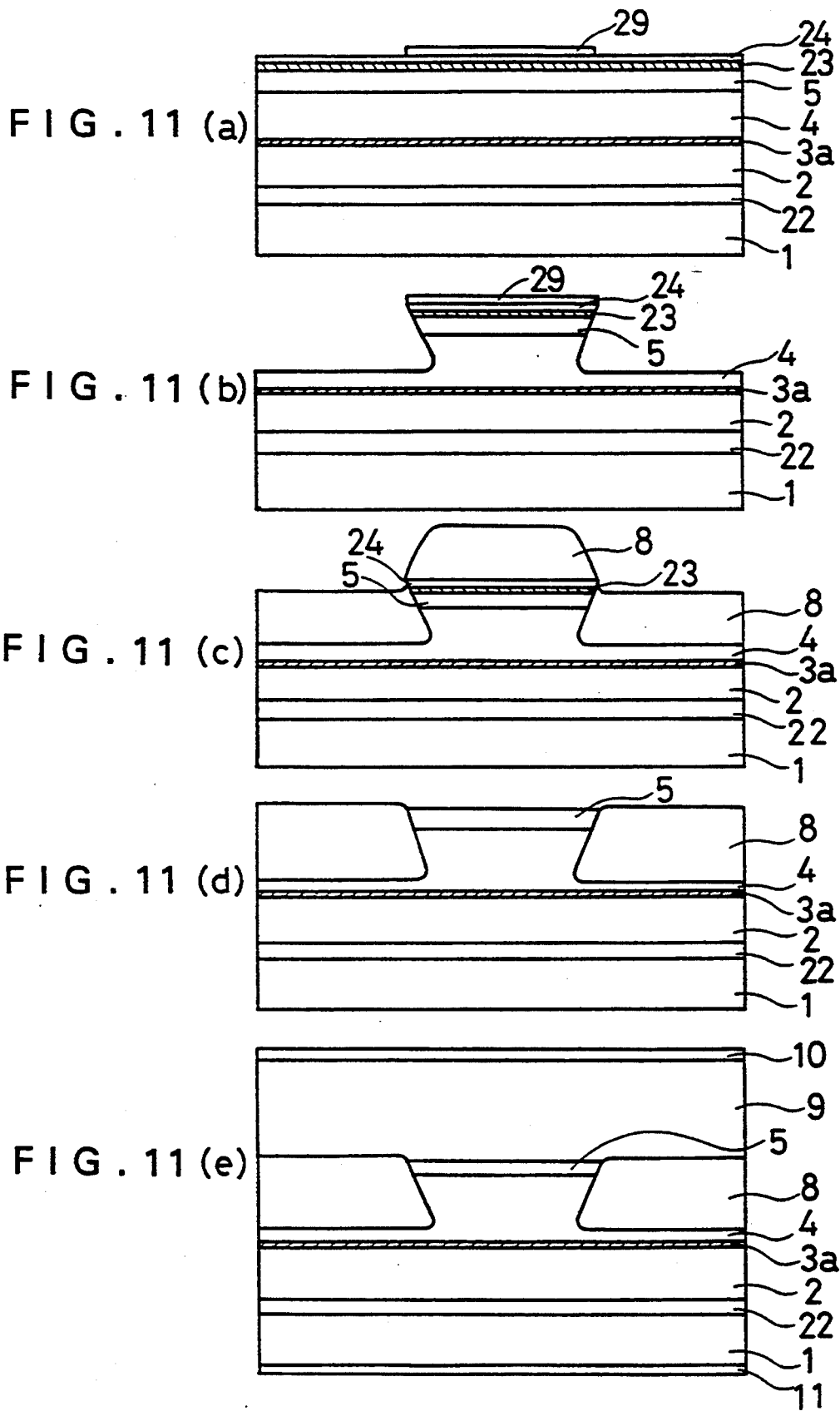
FIGS. 11(a)–11(e) are cross-sectional views illustrating process steps in a method for producing a semiconductor laser device in accordance with a fifth embodiment of the present invention.

Initially, as illustrated in FIG. 11(a), an n type GaAs buffer layer 2, an n type $Al_{0.5}Ga_{0.5}As$ first cladding layer 2, an active layer 3a having a multi quantum well structure, a p type $Al_{0.5}Ga_{0.5}As$ second cladding layer 4, and a p type GaAs first cap layer 5 are successively grown on an n type GaAs substrate 1 by MOCVD (first epitaxial growth step). Then, an AlAs layer 23 about 100 angstroms thick and an $Al_{0.8}Ga_{0.2}As$ cap layer 24 about 100 angstroms thick are successively grown on the p type GaAs cap layer 5. The $Al_{0.8}Ga_{0.2}As$ cap layer 24 protects the AlAs layer 23 from deliquescence and efflorescence during the production process. Then, a resist pattern having a prescribed width is formed on the cap layer 24 by conventional photolithographic and selective etching steps.

Then, using the resist pattern 29 as a mask, the epitaxial layers on the substrate 1 are immersed in hydrofluoric acid for a moment, whereby prescribed portions of the AlAs layer 23 and the $Al_{0.8}Ga_{0.2}As$ cap layer 24 are removed. Preferably, the immersion is carried out for 1~10 seconds. If the immersion is carried out longer than that, the etchant, i.e., hydrofluoric acid, etches the AlAs layer 23 and the $Al_{0.8}Ga_{0.2}As$ cap layer 24 beneath the resist pattern 29. Thereafter, the epitaxial layers on the substrate 1 are immersed in a solution in which hydrogen peroxide solution and tartaric acid are mixed in a ratio of 1:2~1:6, whereby the p type GaAs first cap layer 5 and the p type $Al_{0.5}Ga_{0.5}As$ second cladding layer 4 at opposite sides of the mask 29 are etched to a prescribed depth, resulting in a ridge shown in FIG. 11(b). During the etching for forming the ridge, the AlAs layer 23 and the $Al_{0.8}Ga_{0.2}As$ cap layer 24 serve as an etching mask because these layers are not etched by the etchant. In addition, since the AlAs layer 23 and the $Al_{0.8}Ga_{0.2}As$ cap layer 24 are epitaxial layers successively grown on the p type GaAs first cap layer 5, adhesion between the AlAs layer 23 and the p type GaAs first cap layer 5 is higher than adhesion between the p type GaAs first cap layer 5 and a conventional insulating film serving as an etching mask, such as a silicon oxide film or a silicon nitride film. Therefore, the etchant does not permeate into a boundary between the AlAs layer 23 and the p type GaAs first cap layer 5, so that the side etching of the p type GaAs first cap layer 5 is avoided.

After the resist pattern 29 is removed, a second epitaxial growth step is carried out to grow an n type GaAs current blocking layer 8 on opposite sides of the ridge and on the $Al_{0.8}Ga_{0.2}As$ cap layer 24 as shown in FIG. 11(c). Then, the wafer is immersed in hydrofluoric acid for more than three minutes, whereby the AlAs layer 23 and the $Al_{0.8}Ga_{0.2}As$ cap layer 24 are removed together with the n type GaAs layer 8 on the cap layer 24 as shown in FIG. 11(d). Then, a third epitaxial growth, step is performed to grow a p type GaAs contact layer 9 on the ridge and the n type GaAs current blocking layer 8. Thereafter, a p side electrode 10 and an n side electrode 11 are formed on the contact layer 9 and the rear surface of the substrate 1, respectively, completing a semiconductor laser device shown in FIG. 11(e).

Figure 12:
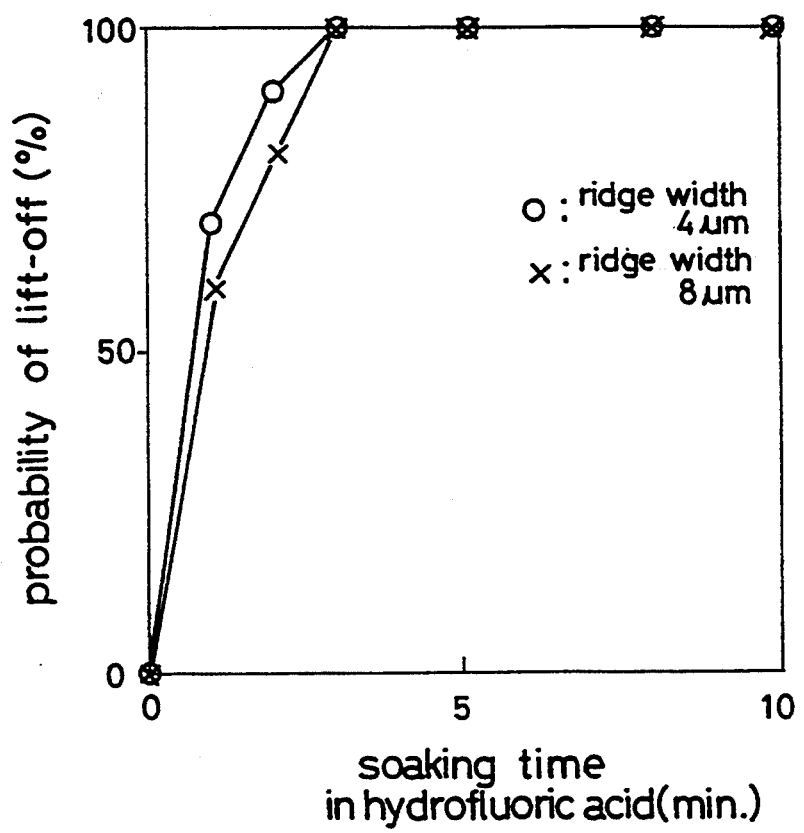
FIG. 12 is a graph illustrating removability of an n type GaAs layer in hydrofluoric acid in the step of FIG. 11(d)

FIG. 12 is a graph showing removability of the n type GaAs layer 8 in hydrofluoric acid in the step of FIG. 11(d), i.e., the step of removing the n type GaAs layer 8 on the ridge by lift-off. In FIG. 12, the abscissa shows immersion time in hydrofluoric acid and the ordinate shows percentage of number of ridges from which GaAs layers are completely removed by lift-off while immersed in hydrofluoric acid. In this case, a wafer having a diameter of 2 inches, on which fifty stripe-shaped ridges each having a width of 4 microns and fifty stripe-shaped ridges each having a width of 8 microns are formed, is immersed in hydrofluoric acid to obtain the result shown in FIG. 12. It is seen from FIG. 12 that the n type GaAs layer 8 on the ridge is completely removed when immersed in hydrofluoric acid for more than three minutes.

According to the fifth embodiment of the present invention, since the AlAs layer 23 is tightly adhered to the p type GaAs first cap layer 5, the etchant does not permeate between these layers during the etching for forming the ridge, so that the side etching of the p type GaAs first cap layer 5 is avoided. Therefore, in the second epitaxial growth step, the n type GaAs current blocking layer 8 is evenly grown on both sides of the ridge without generating concave portions. In addition, the AlAs layer 23 and the $Al_{0.8}Ga_{0.2}As$ cap layer 24 are easily removed by hydrofluoric acid. Accordingly, the p type GaAs contact layer 9 is evenly grown on the flat surface and the p side electrode 10 is evenly and reliably connected to the contact layer 9, resulting in a high-performance and high-reliability semiconductor laser device.

Although the $Al_{0.8}Ga_{0.2}As$ cap layer 24 is employed in the fifth embodiment, the same effects as described above are achieved when the Al ratio is more than 0.5.

FIGS. 13(a)-13(e) are cross-sectional views of steps in a method for producing a semiconductor device in accordance with a sixth embodiment of the present invention. In the figures, the same reference numerals as in FIG. 1 designate the same or corresponding parts. Reference numeral 3a designates an active layer comprising a multi quantum well structure in which about 100 angstroms thick AlGaAs layers and about 100 angstroms GaAs layers are alternatingly laminated. Reference numeral 25 designates a silicon nitride film and numeral 26 designates a silicon oxide film.

Figure 13A:
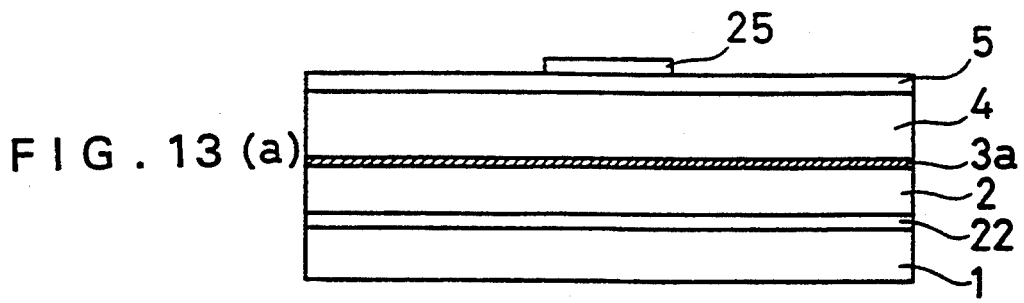
FIGS. 13(a)–13(e) are cross-sectional views illustrating process steps in a method for producing a semiconductor laser device in accordance with a sixth embodiment of the present invention.

Initially, as illustrated in FIG. 13(a), there are successively grown on an n type GaAs substrate 1, an n type AlGaAs first cladding layer 2, an active layer 3a comprising a multi quantum well structure, a p type AlGaAs second cladding layer 4, and a p type GaAs first cap layer 5 (first crystal growth). Preferably, these layers are grown by MOCVD at a growth temperature of 750° C. Then, a silicon nitride film 25 is formed on the p type GaAs first cap layer 5. The width of the silicon nitride film 25 should be decided on the basis of height and width of a ridge which is formed in the subsequent step.

Figure 13B:
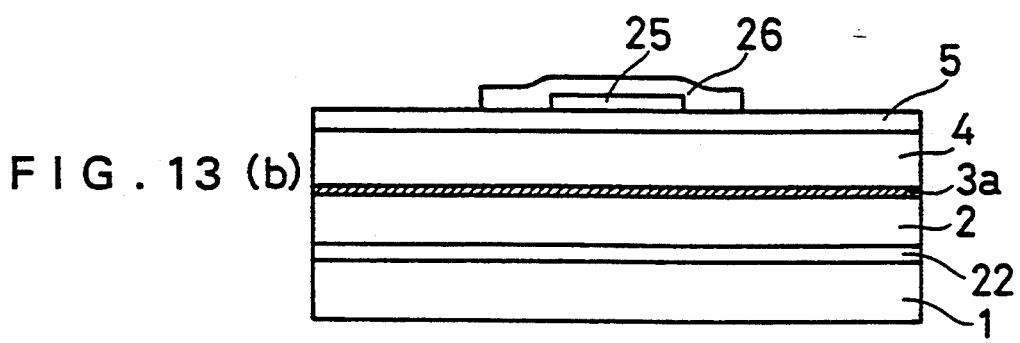
Figure 13C:
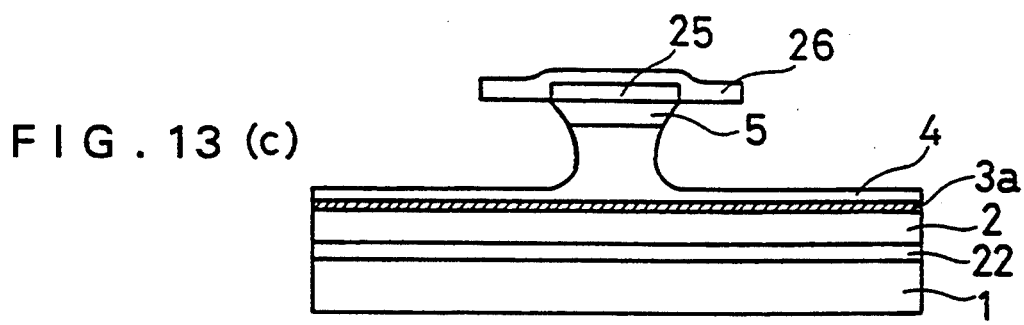
Figure 13D:
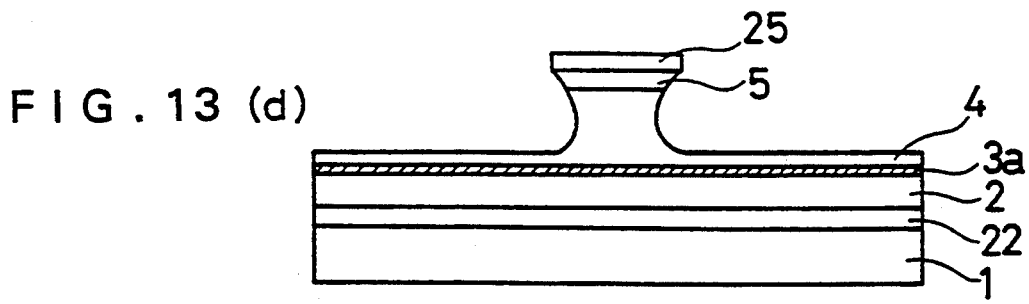
Figure 13E:
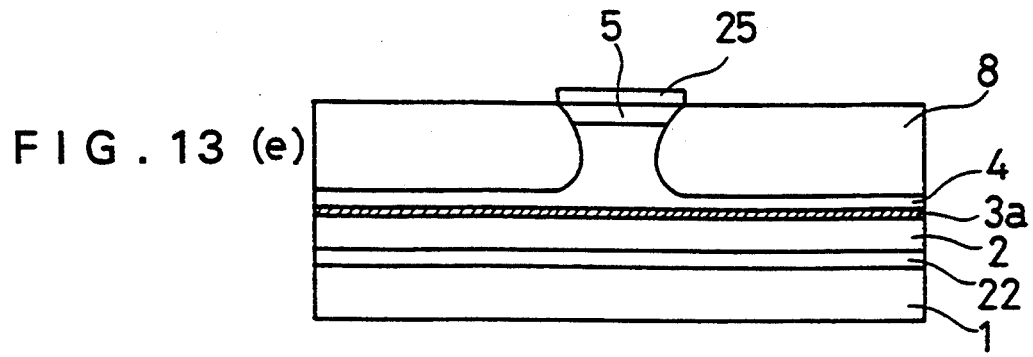

Thereafter, as illustrated in FIG. 13(b), a silicon oxide film 26 having a prescribed width is formed on the p type GaAs first cap layer 5 covering the silicon nitride film 25. The ends of the silicon oxide film 26 protrude beyond the ends of the silicon nitride film 25 by the same width at opposite sides. Thereafter, using the silicon nitride film 25 and the silicon oxide film 26 as a mask, the p type AlGaAs second cladding layer 4 and the p type GaAs first cap layer 5 are etched by wet etching using a solution comprising sulfuric acid, hydrogen peroxide, and water, leaving the p type AlGaAs second cladding layer 4 0.2~0.3 micron thick on the active layer 3a at opposite sides of the mask, resulting in a ridge shown in FIG. 3(c). The wet etching is carried out until the width of the ridge becomes equal to or a little narrower than the width of the silicon nitride film 25. Then, the silicon nitride film 25 and the silicon oxide film 26 are etched with hydrofluoric acid. During the etching, only the silicon oxide film 26 is etched away leaving the silicon nitride film 25 on the ridge because the etching rate of the silicon oxide film in hydrofluoric acid is more than ten times as high as that of the silicon nitride film. Thereafter, as illustrated in FIG. 13(e), using the silicon nitride film 25 as a mask, an n type GaAs current blocking layer 8 is grown at opposite sides of the ridge. After removing the silicon nitride film 25, a p type GaAs contact layer 9 and electrodes 10 and 11 are formed in the same manner as shown in FIG. 11(e) to complete the semiconductor laser device.

In this way, the width of the ridge is easily approximated to the width of the mask 25, so that the n type GaAs current blocking layer 8 is evenly grown on the opposite sides of the ridge. Therefore, the p type GaAs contact layer 9 is evenly grown on the flat surface of the wafer and the p side electrode 10 is evenly and reliably connected to the contact layer 9, resulting in a high-performance and high-reliability semiconductor laser device.

FIGS. 14(a)-14(e) are cross-sectional views of steps in a method for producing a semiconductor laser device in accordance with a seventh embodiment of the present invention. In the figures, the same reference numerals as in FIG. 1 designate the same or corresponding parts. Reference numerals 27 and 27a are silicon nitride films and numeral 28 designates a resist pattern.

Initially, as illustrated in FIG. 14(a), an n type AlGaAs first cladding layer 2, an active layer 3a comprising a multi quantum well structure, a p type AlGaAs second cladding layer 4, and a p type GaAs first cap layer 5 are successively grown on an n type GaAs substrate 1 (first epitaxial growth). Then, one silicon nitride film 27 having a prescribed width is formed on the first cap layer 5. Then, as illustrated in FIG. 14(b), a resist pattern 28 narrower than the silicon nitride film 27 is disposed in the center of the silicon nitride film 27. Then, using the silicon nitride film 27 as a mask, the p type AlGaAs second cladding layer 4 and the p type GaAs first cap layer 5 are etched in the same manner as described in the sixth embodiment, providing a ridge shown in FIG. 14(c). At this time, the etching is carried out until the width of the ridge becomes equal to or a little narrower than the width of the resist pattern 28. Then, as illustrated in FIG. 14(d), using the resist pattern 28 as a mask, both ends of the silicon nitride film 27 are etched away, leaving a silicon nitride film 27a having a width approximately equal to the width of the ridge. Then, as illustrated in FIG. 14(e), the resist pattern 28 is removed and an n type GaAs current blocking layer 8 is epitaxially grown on the both sides of the ridge. After removing the silicon nitride film 27a, a p type GaAs contact layer 9 and electrodes 10 and 11 are formed in the same manner as shown in FIG. 11(e), completing the semiconductor laser device.

In this way, the width of the ridge is approximated to the width of the mask 27a, and the n type GaAs current blocking layer 8 is evenly grown on the opposite sides of the ridge. Therefore, the p type GaAs contact layer 9 is evenly grown on the flat surface of the wafer and the p side electrode 10 is evenly and reliably connected to the contact layer 9, resulting in a high-performance and high-reliability semiconductor laser device.

This seventh embodiment is similar to the third embodiment in that the both ends of the silicon nitride pattern are removed after forming the ridge. While in the third embodiment plasma etching is employed for the side etching of the silicon nitride film 6 beneath the resist pattern 7, in this seventh embodiment the side etching of the silicon nitride film 27 is carried out by a conventional wet etching using the resist pattern 28 as a mask, whereby the process is simplified as compared with the third embodiment. In addition, since the width of the ridge is aligned with the width of the resist pattern 28, the dimensional precision of the ridge is improved.

Figure 15:
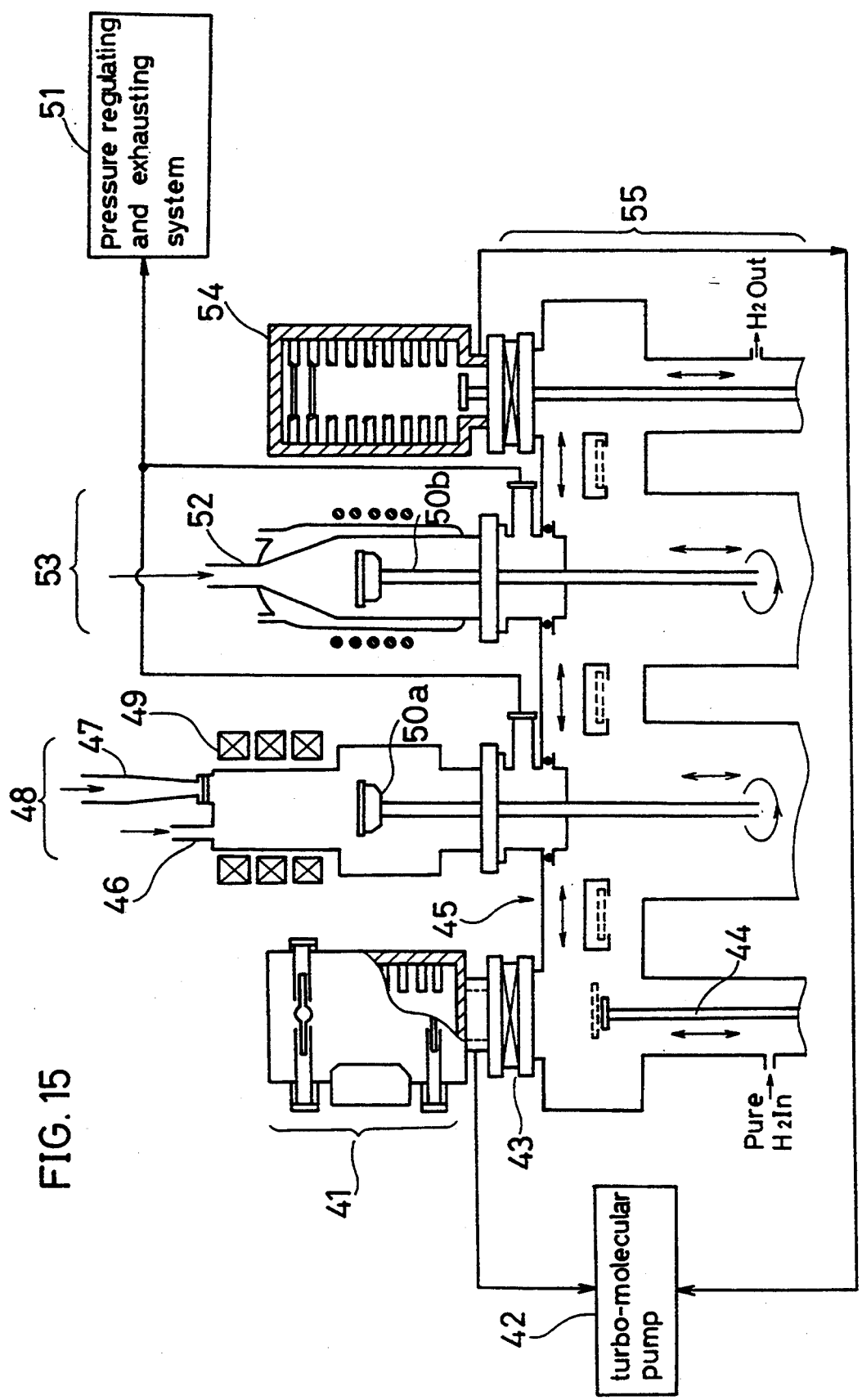
FIG. 15 is a schematic diagram illustrating an MOCVD apparatus for producing a semiconductor device, in accordance with an eighth embodiment of the present invention.

FIG. 15 is a diagram showing an MOCVD apparatus for producing a semiconductor device in accordance with a eighth embodiment of the present invention. This apparatus includes an MOCVD chamber 53 for crystal growth, an electron cyclotron resonance plasma chamber (hereinafter referred to as ECR plasma chamber)

for vapor phase etching, and wafer storing chambers 41 and 54. These chambers are connected by a wafer conveyer 45 which automatically conveys a wafer from one chamber to another chamber.

The operation will be described.

A plurality of wafers are stored in a wafer storing chamber 41 filled with nitrogen. First of all, the wafer storing chamber 41 is evacuated by absorbing the nitrogen in the chamber 41 by a turbo molecular pump 42 (hereinafter referred to as TMP). Then, hydrogen is introduced into the chamber 41 by the TMP 42 and then a gate valve 43 is opened. At this time, the inside of the wafer conveyer 45 and the inside of a load lock system 55 are filled with hydrogen. Then, a vertically movable wafer supporter 44 rises up and takes out a wafer from the wafer storing chamber 41. The wafer is automatically sent into the ECR plasma chamber 48 by the wafer conveyer 45. The ECR plasma chamber 48 is provided with an etching gas inlet 46, a microwave inlet 47, magnetic coil 49, and a vertically movable stage 50a. In the ECR plasma chamber 48, the wafer is dry etched. Thereafter, the wafer is taken out from the ECR plasma chamber 48 and sent to the MOCVD chamber 53 by the wafer conveyer 45. The MOCVD chamber 53 is provided with a source gas inlet 52 and a vertically movable stage 50b. A source gas comprising an organometallic compound is introduced into the chamber 53 through the inlet 52. In the MOCVD chamber 53, a crystal growth is carried out on the wafer. Then, the wafer is taken out from the MOCVD chamber 53 and sent to a wafer storing chamber 54 by the wafer conveyer 54. In this way, a plurality of wafers stored in the wafer storing chamber 41 are conveyed one by one by the wafer conveyer 45, subjected to the dry etching and the crystal growth steps, and finally stored in the wafer storing chamber 54.

Figure 16:
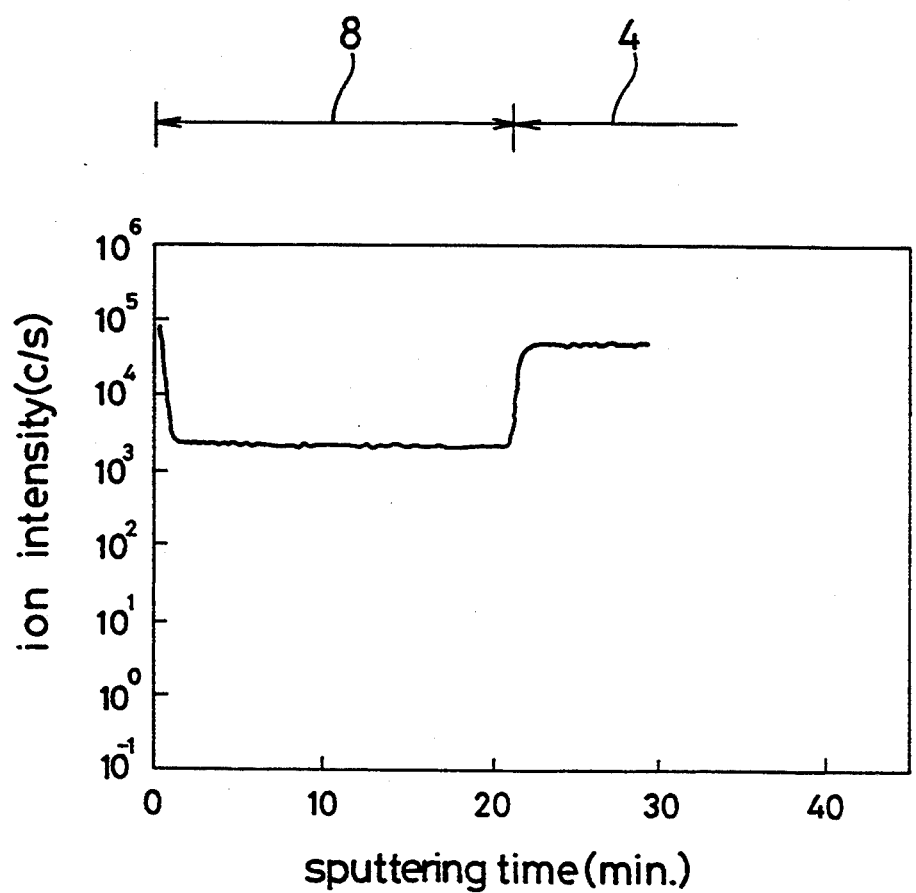
FIG. 16 is a graph illustrating a profile of oxygen density measured by SIMS in a p type AlGaAs second cladding layer and an n type GaAs current blocking layer included in a semiconductor laser device produced by the MOCVD apparatus of FIG. 15.

Process steps for producing a semiconductor device using the apparatus of FIG. 15 will be described. After the step of forming the ridge ! in the above-described third embodiment, the wafer, i.e., the n type GaAs substrate 1 is stored in the wafer storing chamber 41. Then, in the ECR plasma chamber 48, plasma etching using hydrogen plasma is applied to the p type AlGaAs second cladding layer 4 exposed on the surface and then the wafer is sent to the MOCVD chamber 53 by the wafer conveyer 45 in hydrogen atmosphere. In the MOCVD chamber 53, the n type GaAs current blocking layer 8 and the p type GaAs second cap layer 50 are grown and then the p type GaAs contact layer 9 and the p side and n side electrodes 10 and 11 are formed. FIG. 16 shows a profile of oxygen density measured by SIMS in the p type AlGaAs second cladding layer 4 and the n type GaAs current blocking layer 8. As shown in FIG. 16, oxygen is not localized at the boundary between these layers, reducing leakage current at this region. In addition, since the crystallinities of the n type GaAs current blocking layer 8 and the p type GaAs second cap layer 50 are improved, device characteristics of the semiconductor laser device are significantly improved as compared with the device fabricated in the above-described third embodiment.

While in the above-described eighth embodiment the ECR plasma chamber 48 and the MOCVD chamber 53 are used, two MOCVD chambers may be used and one of them is used as a chamber for vapor phase etching in which a vapor phase of HCl, Cl$_2$, or H$_2$S gas is used to etch to the p type AlGaAs second cladding layer 4. Alternatively, a RIE (Reaction Ion Etching) chamber may be used instead of the ECR plasma chamber 48, in which an ion beam etching is applied to the p type AlGaAs second cladding layer 4. Also in these cases, the same effects as described in the eighth embodiment are achieved.

Figure 9A:
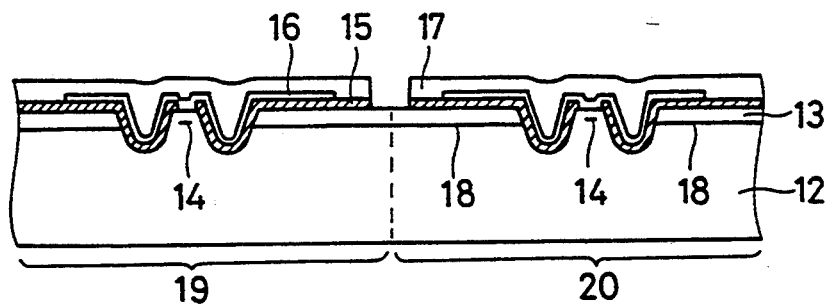
FIGS. 9(a) to 9(c) are cross-sectional views illustrating process steps in a method for dividing a semiconductor substrate, on which a plurality of p type InP ridge waveguide semiconductor laser elements are disposed, into a plurality of semiconductor laser chips.
Figure 9B:
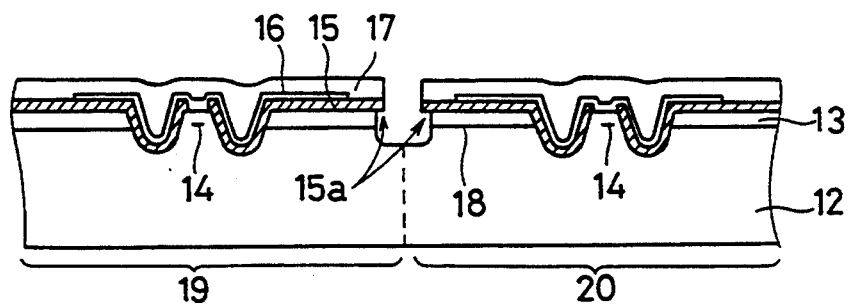
Figure 9C:
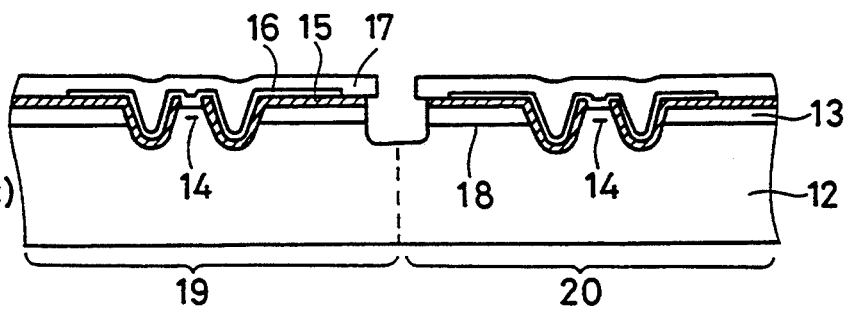

FIGS. 9(a)–9(c) are cross-sectional views of process steps in a method for dividing a semiconductor substrate, on which a plurality of p type InP ridge waveguide semiconductor laser elements are disposed, into a plurality of semiconductor laser chips. In the figures, semiconductor laser elements 19 and 20 are adjacent to each other on a p type InP substrate 12. In each semiconductor element, a ridge is formed in the substrate 12 and an undoped InGaAsP active layer 14 is formed in the ridge. An InP epitaxial layer 13 is disposed on the p type InP substrate 12 at opposite sides of the ridge. An SiO$_2$ film 15 is disposed on the entire surface except for the center of the top surface of the ridge. An n side electrode 16 is disposed on the ridge and the SiO$_2$ film 15. Reference numeral 18 designates a boundary between the p type InP substrate 12 and the InP epitaxial layer 13 and numeral 17 designates a photoresist.

First of all, as illustrated in FIG. 9(a), a photoresist 17 is deposited on the entire surface of the p type InP substrate 12 on which the semiconductor elements 19 and 20 are present. Then, the photoresist 17 is patterned to form a stripe groove of approximately 5 microns width between the elements 19 and 20. Then, using the photoresist 17 as a mask, the SiO$_2$ film 15 is etched away to expose the surface of the epitaxial layer 13.

Then, as illustrated in FIG. 9(b), using the SiO$_2$ film 15 as a mask, the InP substrate 12 and the epitaxial layer 13 are etched by a wet etching using an etchant including hydrochloric acid to form a groove 21 deeper than the boundary 18. In this case, over-hanging portions 15a about 2 microns long are formed on both ends of the groove 23 because of the side etching of the layers 12 and 13. Then, as illustrated in FIG. 9(c), using the photoresist 17 as a mask, the over-hanging portions 15a of the SiO$_2$ film 15 are removed by a plasma etching using CF$_4$. Finally, the p type InP substrate 12 is cut along the groove 21, whereby the semiconductor laser elements 19 and 20 are separated from each other.

Figure 20A:
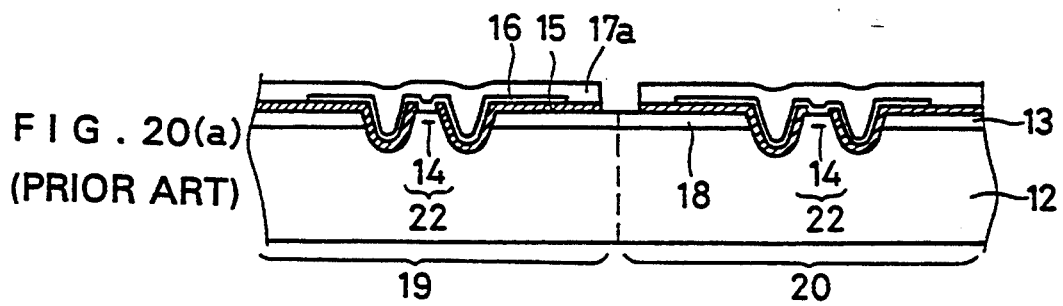
FIGS. 20(a)–20(c) are cross-sectional views illustrating process steps in a method for dividing a semiconductor substrate, on which a plurality of p type InP ridge waveguide semiconductor laser elements are disposed, into a plurality of semiconductor laser devices.
Figure 20B:
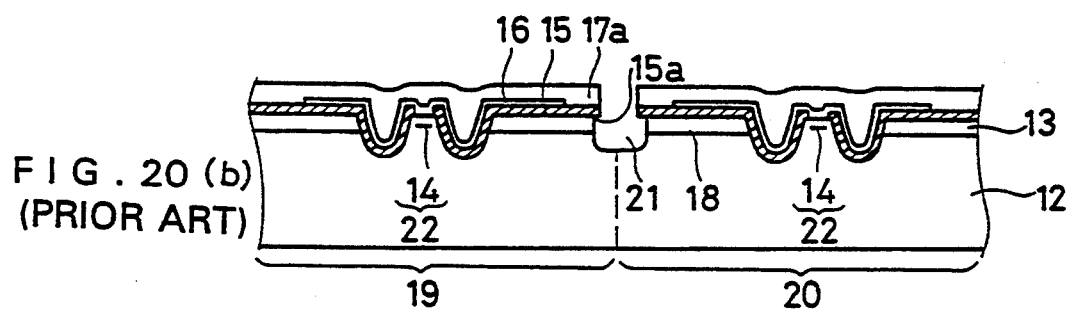
Figure 20C:
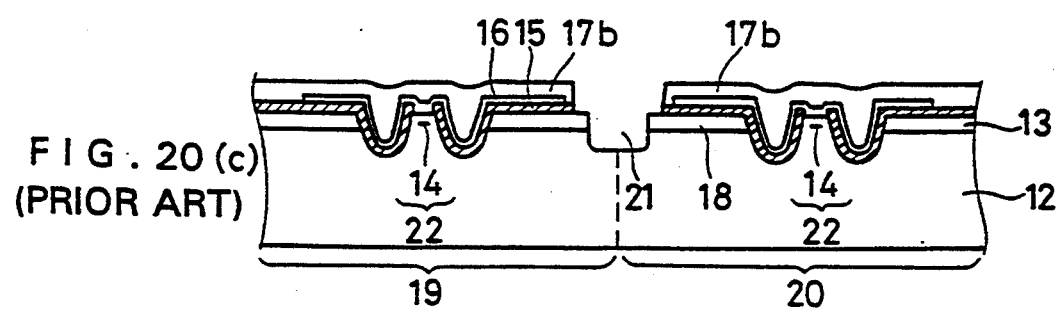
Figure 21:
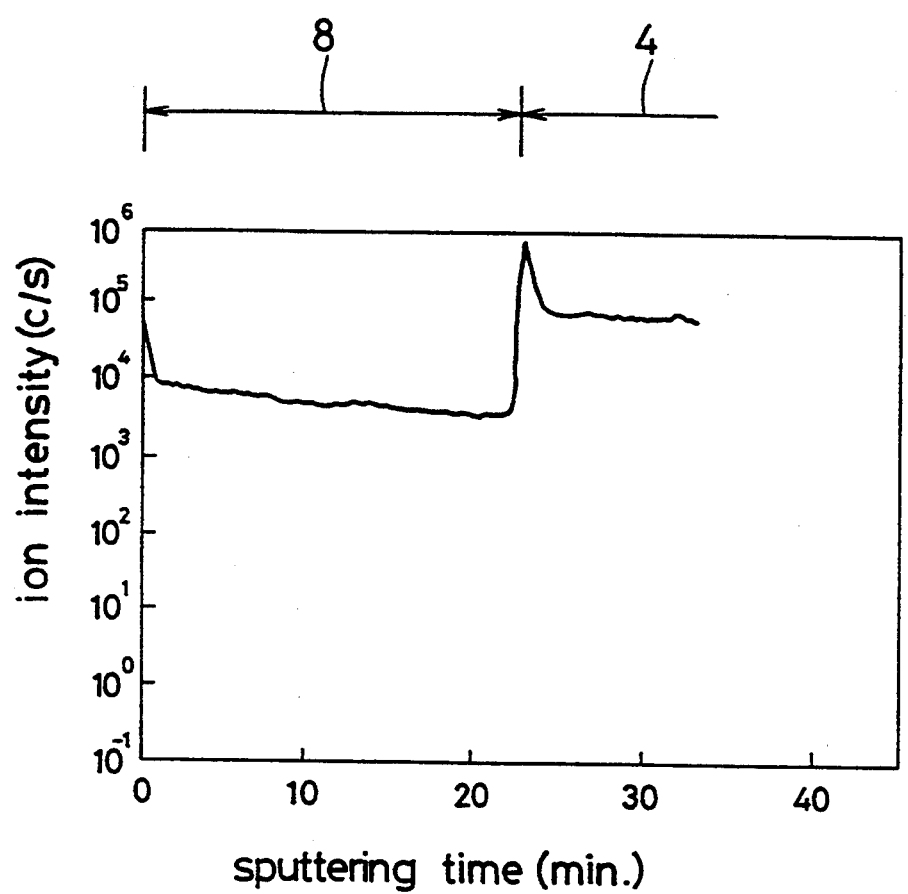
FIG. 21 is a graph illustrating oxygen concentrations determined by SIMS analysis in a p type AlGaAs second cladding layer and an n type GaAs current blocking layer in the steps of FIGS. 18(a)–18(e).

According to the ninth embodiment of the present invention, there is no necessity of forming the resist pattern 17b on the over-hanging portions to remove the over-hanging hanging portions as in the conventional method shown in FIG. 20(c), so that the process is simplified. In addition, the removal of the over-hanging portions 15a is selectively carried out by the plasma etching using CF$_4$, so that only the over-hanging portions 15a are removed with high precision even if the width of the groove between the elements 19 and 20 is only several microns. As the result, highly-reliable semiconductor laser devices are produced with high efficiency.

In the above-described first to eighth embodiments of the present invention, the semiconductor laser device, which is obtained by growing AlGaAs series materials on the GaAs substrate and oscillates at a wavelength in the 0.7 to 0.9 micron band, is employed, but the present invention may be applied to a semiconductor laser device, which is obtained by growing InGaAsP series materials on a p type InP substrate and oscillates at a wavelength in the 1 micron band or a semiconductor laser device which is obtained by growing InGaAsP series materials on a GaAs substrate and oscillates at a wavelength in the 0.5 to 0.7 micron band.

In the above-described first to ninth embodiments of the present invention, methods for fabricating semiconductor laser devices are described, but the present invention may be applied to methods for fabricating other semiconductor devices in which a ridge in a reverse mesa shape is formed by patterning semiconductor epitaxial layers, a second epitaxial layer is grown on opposite sides of the ridge, and a third epitaxial layer is grown on the ridge and the second epitaxial layer.

As is evident from the foregoing description, according to the present invention, a ridge in a reverse mesa shape is formed by removing portions of a first semiconductor layer by wet etching using an insulating film pattern as a mask, both ends of the insulating film pattern are etched away to approximately the width of the ridge, a second semiconductor layer is epitaxially grown on opposite sides of the ridge using the insulating film pattern as a mask for the crystal growth, and a third semiconductor layer is epitaxially grown on the whole surface of the wafer. Therefore, during the epitaxial growth, the reaction gas evenly spreads at both sides of the ridge, so that the second semiconductor layer is evenly grown without concave portions at both sides of the ridge. As the result, a semiconductor device with improved characteristics and high reliability is produced with high reproducibility.

In addition, according to the present invention, after approximating the width of the mask pattern to the width of the ridge, the side walls of the ridge are lightly etched. Therefore, the upper end portions of the ridge are not exposed when the end portions of the mask pattern on the ridge are etched away. As the result, no convex portions are formed at both sides of the ridge while growing a semiconductor layer on both sides of the ridge, so that a uniform semiconductor layer is epitaxially grown on the ridge and the semiconductor layer on both sides of the ridge. As the result, reliability of the semiconductor device is significantly improved.

In addition, according to the present invention, a mask pattern, which is used when a ridge is formed by removing prescribed portions of a first semiconductor layer by wet etching and a second semiconductor layer is epitaxially grown on opposite sides of the ridge, is formed on the first semiconductor layer so that the width of the mask pattern may be reduced to a prescribed width after the ridge is formed. Therefore, after the ridge is formed, both end portions of the mask are removed and then the second semiconductor layer is epitaxially grown. In addition, the width of the ridge is equal to or narrower than the width of the mask pattern that is reduced after the formation of the ridge, so that the second semiconductor layer is grown without concave portions at the opposite sides of the ridge, improving the dimensional precision of the device. As result, a semiconductor device with improved characteristics and high reliability is produced with high reproducibility.

In addition, according to the present invention, a mask pattern, which is used when a ridge is formed by removing prescribed portions of a first semiconductor layer by wet etching and a second semiconductor layer is epitaxially grown on opposite sides of the ridge, is formed of a semiconductor epitaxial layer. Therefore, when the ridge is formed, the etchant does not permeate into the boundary between the mask pattern and the first semiconductor layer, preventing side etching of the ridge. Therefore, no concave portion is formed at opposite sides of the ridge and the second semiconductor layer is evenly grown at opposite sides of the ridge. As the result, a semiconductor device with improved characteristics and high reliability is produced with high reproducibility.

In addition, according to the present invention, when a ridge is formed by removing prescribed portions of a first semiconductor layer by wet etching and a second semiconductor layer is epitaxially grown on opposite sides of the ridge, the thickness of the second semiconductor layer is in a range of ±0.3 micron plus the height of the ridge. Therefore, a third semiconductor layer is evenly grown on the ridge and the second semiconductor layer with a flat surface, resulting in a highly-reliable semiconductor device.

In addition, according to the present invention, a ridge is formed by removing prescribed portions of semiconductor epitaxial layers including an AlGaAs layer by wet etching, an $Al_xGa_{1-x}As$ low temperature buffer layer ($0 \leq X \leq 1$) is grown on the AlGaAs layer exposed at opposite sides of the ridge at a temperature lower than a growth temperature of a GaAs layer, and a GaAs layer is epitaxially grown on the low temperature buffer layer. Therefore, amorphous AlGaAs grows on under surfaces of over-hanging portions of a mask pattern and fills up fine grooves on the surface of the AlGaAs layer exposed at opposite sides of the ridge, whereby concave portions beneath the over-hanging portions are reduced and the surface of the AlGaAs layer is made even. Therefore, the GaAs layer is evenly and reliably grown without concave portions at opposite sides of the ridge. As the result, a semiconductor device with improved characteristics and high reliability is produced with high reproducibility.

In addition, according to the present invention, a ridge is formed by removing prescribed portions of semiconductor epitaxial layers including an AlGaAs layer by wet etching, a superlattice buffer layer is grown on the AlGaAs layer exposed at opposite sides of the ridge, and a GaAs layer is epitaxially grown on the low temperature buffer layer. Therefore, dislocations between the AlGaAs layer and the superlattice buffer layer spread in the transverse direction through the superlattice buffer layer, so that the device is not affected by localized oxygen and fine grooves on the surface of the AlGaAs layer. AS the result, the GaAs layer is evenly and reliably grown without concave portions at opposite sides of the ridge. As the result, a semiconductor device with improved characteristics and high reliability is produced with high reproducibility.

In addition, according to the present invention, when a ridge is formed by removing prescribed portions of semiconductor epitaxial layers including an AlGaAs layer by wet etching and then a GaAs layer is epitaxially grown on the AlGaAs layer exposed at opposite sides of the ridge, the growth of the GaAs layer is once stopped in an initial stage of the growth. Therefore, the atoms of the GaAs crystal are rearranged to make the GaAs crystal a monocrystal, so that crystallinity of the GaAs epitaxial layer on opposite sides of the ridge is improved. As the result, characteristics of the semiconductor device are improved.

In addition, according to the present invention, a semiconductor layer is epitaxially grown on a semiconductor substrate, a plurality of semiconductor elements are formed in prescribed regions of the semiconductor layer and the semiconductor substrate, and a photoresist pattern having a plurality of apertures is formed on the substrate. The apertures of the photoresist pattern are positioned on regions between adjacent semiconductor elements. Then, apertures of an insulating film, which is disposed beneath the photoresist pattern, are formed using the photoresist pattern as a mask, and portions of the semiconductor layer and the semiconductor substrate are removed by wet etching using the insulating film as a mask to form grooves deeper than a boundary between the semiconductor layer and the semiconductor substrate. Then, over-hanging portions of the insulating film above the grooves are removed by plasma etching using the photoresist pattern as a mask. Finally, the semiconductor substrate is divided along the grooves, resulting in a plurality of semiconductor chips. Therefore, highly-reliable semiconductor chips are produced in a simple process with high reproducibility.

In addition, according to the present invention, a ridge is formed by removing prescribed portions of semiconductor epitaxial layers including an AlGaAs layer by wet etching, the surface of the AlGaAs layer exposed at opposite sides of the ridge is dry etched in a first reaction chamber. Thereafter, the wafer is sent to a second reaction chamber and a GaAs layer is epitaxially grown on the AlGaAs layer without exposing the surface of the AlGaAs layer to the atmosphere. Therefore, the AlGaAs layer is not affected by reaction products of the etching process, so that a GaAs layer with improved crystallinity is grown on the clean surface of the AlGaAs layer. As the result, a semiconductor device with high performance and high reliability is achieved.

In addition, according to the present invention, a semiconductor laser device includes a ridge in a reverse mesa shape formed by patterning semiconductor epitaxial layers including an AlGaAs layer, an $Al_xGa_{1-x}As$ low temperature buffer layer ($\leq X \leq 1$) grown on the AlGaAs layer exposed at opposite sides of the ridge, and a GaAs layer epitaxially grown on the low temperature buffer layer. Therefore, crystallinity of the current blocking layer is improved and an electrode reliably contacts a contact layer disposed on the ridge and the GaAs epitaxial layer, resulting in a semiconductor device with improved characteristics and high reliability.

In addition, according to the present invention, a semiconductor laser device includes a ridge in a reverse mesa shape formed by patterning semiconductor epitaxial layers including an AlGaAs layer, a superlattice buffer layer grown on the AlGaAs layer exposed at opposite sides of the ridge, and a second semiconductor layer epitaxially grown on the superlattice buffer layer. Therefore, leakage current is reduced, crystallinity of the current blocking layer is improved, and an electrode reliably contacts a contact layer disposed on the ridge and the GaAs epitaxial layer, resulting in a semiconductor device with improved characteristics and high reliability.

What is claimed is:

1. A semiconductor laser device comprising:
   a semiconductor substrate;
   a plurality of epitaxial semiconductor layers including a first cladding layer, an active layer, and a second cladding AlGaAs layer successively disposed on said semiconductor substrate;
   a ridge having a reverse mesa shape and opposed sides formed of part of said second cladding AlGaAs layers;
   an $Al_xGa_{1-x}As$ low temperature buffer layer ($0 < X \leq 1$) disposed on said second cladding AlGaAs layer at opposite sides of said ridge;
   a first epitaxial semiconductor layer disposed on said low temperature buffer layer at opposite sides of said ridge; and
   a second epitaxial semiconductor layer disposed on said ridge and said first semiconductor layer.

2. The device of claim 1 wherein said $Al_xGa_{1-x}As$ low temperature buffer layer is grown at a temperature below 550° C.

3. A semiconductor laser device comprising:
   a semiconductor substrate;
   a plurality of epitaxial semiconductor layers including a first cladding layer, an active layer, and a second cladding AlGaAs layer successively disposed on said semiconductor substrate;
   a ridge having a reverse mesa shape and opposed sides formed of part of said second cladding AlGaAs layer;
   a superlattice buffer layer disposed on said second cladding AlGaAs layer at opposite sides of said ridge;
   a first epitaxial semiconductor layer disposed on said superlattice buffer layer at opposite sides of said ridge; and
   a second epitaxial semiconductor layer disposed on said ridge and said first epitaxial semiconductor layer.

* * * * *

UNITED STATES PATENT AND TRADEMARK OFFICE
CERTIFICATE OF CORRECTION

PATENT NO. :   5,426,658
DATED      :   June 20, 1995
INVENTOR(S) :  Kaneno et al.

It is certified that error appears in the above-indentified patent and that said Letters Patent is hereby corrected as shown below:

Column 22, Line 17, change "layers" to --layer--.

Signed and Sealed this

Twenty-fourth Day of October, 1995

Attest:

BRUCE LEHMAN

*Attesting Officer*         *Commissioner of Patents and Trademarks*